United States Patent [19]
Yamaguchi et al.

[11] Patent Number: 5,953,359
[45] Date of Patent: Sep. 14, 1999

[54] LASER DIODE ARRAY AND FABRICATION METHOD THEREOF

[75] Inventors: Masayuki Yamaguchi; Hiroyuki Yamazaki; Koji Kudo, all of Tokyo, Japan

[73] Assignee: NEC Corporation, Tokyo, Japan

[21] Appl. No.: 08/946,766

[22] Filed: Oct. 8, 1997

[30] Foreign Application Priority Data

Oct. 8, 1996 [JP] Japan ................................. 8-267006

[51] Int. Cl.$^6$ ............................... H01S 3/19; H01S 3/08; H01L 21/20
[52] U.S. Cl. .............................. 372/50; 372/96; 372/23; 438/35
[58] Field of Search .................................. 372/23, 50, 96; 438/23, 32, 35

[56] References Cited

U.S. PATENT DOCUMENTS

| | | | |
|---|---|---|---|
| 4,318,058 | 3/1982 | Mito et al. | 372/50 |
| 4,637,122 | 1/1987 | Carney et al. | 438/35 |
| 4,993,036 | 2/1991 | Ikeda et al. | 372/50 |
| 5,384,797 | 1/1995 | Welch et al. | 372/23 |
| 5,561,682 | 10/1996 | Aoki et al. | 372/50 |

FOREIGN PATENT DOCUMENTS

| | | | |
|---|---|---|---|
| 0732785 | 9/1996 | European Pat. Off. | H01S 3/25 |
| 02310986 | 12/1990 | Japan | H01S 3/18 |
| 715092 | 1/1995 | Japan | H01S 3/18 |
| 870159 | 3/1996 | Japan | H01S 3/18 |
| 8153928 | 6/1996 | Japan | H01S 3/18 |

OTHER PUBLICATIONS

"1.5 μm Compressive–Strained Multiquantum–Well 20–Wavelenghth Distributed–Feedback Laser Arrays" Zah et al.

Electronics Letters; Apr. 23rd 1992; vol. 28; No. 9; pp. 824–825.

"Different wavelength DFB–LD fabrication fully covered the EDFA gain bandwidth within the same wafer" Yamazaki et al.

First Optoelectronics and Communications Conference (OECC '96) Technical DIgest; Jul. 1996; pp. 16–17.

"Selective metalorganic vapor phase epitaxial growth of InGaAsP/InP layers with bandgap energy control in InGaAs/InGaAsP multiple–quantum well structures" Sasaki et al; Journal of Crystal Growth 132 (1993) pp. 435–443 (no month available).

(List continued on next page.)

*Primary Examiner*—Rodney Bovernick
*Assistant Examiner*—Quyen Phan Leung
*Attorney, Agent, or Firm*—Hayes Soloway Hennessey Grossman & Hage PC

[57] ABSTRACT

First to n-th single-axial-mode LDs are arranged on a semiconductor substrate, where $n \geq 2$. Each of the first to n-th LDs has a stripe-shaped semiconductor active layer formed on or over the substrate, a stripe-shaped semiconductor guiding layer formed on one side of the active layer, and a stripe-shaped semiconductor cladding layer formed on the other side of the active layer. The guiding layers of the first to n-th LDs have first to n-th diffraction gratings, respectively. The (k+1)-th period is equal to a sum of the k-th period and an increment, where $1 \leq k$ S $(n-1)$. The active layers of the first to n-th LDs have first to n-th gain peak wavelengths, respectively. The (k+1)-th gain peak wavelength is equal to a sum of the k-th gain peak wavelength and an increment. The first to n-th LDs have first to n-th oscillation wavelengths with first to n-th wavelength differences from the first to n-th gain peak wavelengths, respectively. The first to n-th wavelength differences are within a specific acceptable range for low threshold currents and low wavelength chirping. The lasing characteristic fluctuation is limited within the acceptable range independent of an oscillation wavelength span of the LDs.

9 Claims, 14 Drawing Sheets

OTHER PUBLICATIONS

Furushima et al.; "Wide Temperature Range Operation of 1.3 μmStrained MOW Lambda/4–Shifted DFB LD's for 2.5 Gb/s Transmission Modules without Temperature Control"; Proc. 21st Eurp. Conf. on Opt. Comm. Sep. 17, 1995; pp. 537–540.

Katoh Y et al.; "Four–Wavelength DBR Laser Array Using Selective MOCVD Growth"; Jul. 1, 1994 ; pp. 21–26, Electronics & Communications in Japan, Part II—Electronics, vol. 77, No. 7.

LASER DIODE ARRAY AND FABRICATION METHOD THEREOF

BACKGROUND OF THE INVENTION

1. Field of the Invention

The present invention relates to a laser diode (LD) array and more particularly, to an LD array including a plurality of LDs that have different oscillation wavelengths and that are arranged to form an array on a semiconductor substrate, which is applicable to the Wavelength-Division-Multiplexed (WDM) optical transmission systems, and a fabrication method of the LD array.

2. Description of the Prior Art

In recent years, with the increasing need for transmission of the multimedia information, much attention has been becoming attracted to the WDM optical transmission technique because this technique makes it possible to increase the capacity of information transmission through an optical fiber.

In the WDM optical transmission systems, the high-gain wavelength region (i.e., 1530 nm to 1562 nm) of an Erbium-Doped optical Fiber Amplifier (EDEA) is typically used. To effectively utilize this wavelength region, a plurality of LDs having different oscillation wavelengths within this bandwidth of approximately 30 nm need to be provided on a semiconductor substrate, producing an LD array.

A fabrication method of this conventional LD array is disclosed in a paper written by H. Yamazaki et al., First Optoelectronics and Communications Conference (OECC '96), Technical Digest, July 1996. In this method, a plurality of diffraction gratings having different pitches or periods for the LDs are formed on a semiconductor substrate by Electron-Beam (EB) exposure and etching processes. Distributed-FeedBack (DFB)-type LDs are formed on these gratings, respectively. Thus, the same diffraction gratings as those on the substrate are formed on the substrate-side surfaces of the guiding layers of these LDs.

Generally, the oscillation wavelength of a DFB-type LD is determined by the period of a grating of its semiconductor guiding layer. Therefore, the DFB-type LDs on the substrate will have different oscillation wavelengths corresponding to the period difference of the gratings.

Thus, the conventional fabrication method disclosed in the technical digest of OECC '96 has an advantage that the unit cost of the LDs is decreased compared with the case where a plurality of semiconductor substrates or wafers are used for obtaining the LDs with the different oscillation wavelengths.

However, the conventional fabrication method disclosed in the technical digest of OECC '96 has the following disadvantage.

Generally, the threshold current of a DFE-type LD is determined by the relationship between the oscillation wavelength $\lambda_{dfb}$ and the gain peak wavelength $\lambda_g$. For example, when the difference of the oscillation wavelength $\lambda_{dfb}$ from the gain peak wavelength $\lambda_g$, i.e., $(\lambda_{dfb}-\lambda_g)$, which is termed the "detuning", becomes large, the threshold current of the LD becomes higher, resulting in difficulty in laser oscillation.

Also, when the directly-modulated DFB-type LD is used for optical communication or transmission systems, the time-dependent fluctuation of the oscillation wavelength $\lambda_{dfb}$, which is termed the "wavelength chirping", needs to be small. The reason is that the large wavelength chirping will cause unacceptable waveform deformation or degradation after the long-distance transmission, which is due to the wavelength dispersion of optical fibers.

It has been known that the differential gain of the LD should be as large as possible for the purpose of suppressing the wavelength chirping, and that the oscillation wavelength $\lambda_{dfb}$ should be set at the short-wavelength side of the gain peak wavelength $\lambda_g$ to make the detuning negative. However, if the detuning $(\lambda_{dfb}-\lambda_g)$ is excessively negative, the threshold current will become higher, as explained above.

As a result, it has been said that the detuning should be negative and have an absolute value of 20 nm or less in order to realize an LD characteristic with a low threshold current and low wavelength chirping.

From this point of view, the conventional fabrication method of an LD array disclosed in the technical digest of OECC '96 has a problem that all of the LDs on the substrate cannot be set to have an optimum negative detuning of −20 nm or less if the oscillation wavelength span of these LDs is over 20 nm. This is because the oscillation wavelength $\lambda_{dfb}$ of each LD is realized by changing the pitch or period of the diffraction gratings while all the LDs have the same gain peak wavelength $\lambda_g$.

For example, in the LD array fabricated by the above conventional fabrication method disclosed in the technical digest of OECC '96, the LDs on the substrate have the different oscillation wavelengths $\lambda_{dfb}$ ranging from 1520 nm to 1563 nm and the same gain peak wavelength $\lambda_g$ of 1520 nm. Therefore, no laser oscillation occurs in the wavelength region longer than 1540 nm where the negative detuning is excessively large.

There is a similar problem in an LD array having DFB-type LDs and optical modulators of the electric-field absorption type, which are integrated on a semiconductor substrate.

The LD array of this sort has been expected as a compact light source for the WDM optical communication or transmission systems because it has a low wavelength chirping. The modulation characteristic of each optical modulator is dependent upon the difference between the absorption edge wavelength $\lambda_m$ of a corresponding one of the modulators and the oscillation wavelength $\lambda_{dfb}$ of a corresponding one of the LDs.

When this wavelength difference $(\lambda_{dfb}-\lambda_m)$, which is also termed the "detuning", is smaller than a specific desired value, the optical absorption in the modulators is excessively large, resulting in an increased extinction ratio and a decreased optical output. Contrarily, when this wavelength difference $(\lambda_{dfb}-\lambda_m)$ is larger than the specific desired value, the optical absorption in the modulators is excessively small, resulting in a decreased extinction ratio and an increased optical output.

Accordingly, from the view point of the proper optical output and the proper extinction ratio, this wavelength difference or "detuning", $(\lambda_{dfb}-\lambda_m)$, needs to be set within the range of ±15 nm from the desired value in order to suppress the characteristic of the LD array within an acceptable fluctuation range. In other words, the wavelength difference $(\lambda_{dfb}-\lambda_m)$ should be set within an optimum range of ±15 nm from the desired value.

As a result, the change of the oscillation wavelengths $\lambda_{dfb}$ of the LDs will cause some deviation of the wavelength difference $(\lambda_{dfb}-\lambda_m)$ from the above optimum range in the optical modulators, which degrades the modulation characteristics of the modulators.

SUMMARY OF THE INVENTION

Accordingly, an object of the present invention is to provide an LD array including LDs in which the lasing characteristic fluctuation of the LDs is limited within an acceptable range independent of an oscillation wavelength span of the LDs and a fabrication method of the LD array.

Another object of the present invention is to provide an LD array including LDs and optical modulators in which the modulation characteristic fluctuation of the optical modulators is limited within an acceptable range independent of an oscillation wavelength span of LDS and a fabrication method of the LD array.

The above objects together with others not specifically mentioned will become clear to those skilled in the art from the following description.

According to a first aspect of the present invention, an LD array is provided. This LD array is comprised of a semiconductor substrate and first to n-th single-axial-mode LDs arranged on the substrate, where n is an integer equal to or greater than 2.

The first to n-th LDs are comprised of first to n-th stripe-shaped semiconductor active layers formed on or over the substrate, first to n-th stripe-shaped semiconductor guiding layers formed on one side of the first to n-th active layers, respectively, and first to n-th stripe-shaped semiconductor cladding layers formed on the other side of the first to n-th active layers, respectively.

The first to n-th guiding layers have first to n-th diffraction gratings with first to n-th periods, respectively. The first to n-th periods have a relationship that the (k+1)-th period is equal to a sum of the k-th period and a period increment, where k is an integer ranging from 1 to (n−1).

The period increment for two adjacent ones of the first to n-th gratings may be constant or variable.

The first to n-th active layers have first to n-th gain peak wavelengths, respectively. The first to n-th gain peak wavelengths have a relationship that the (k+1)-th gain peak wavelength is equal to a sum of the k-th gain peak wavelength and a wavelength increment, where k is an integer ranging from 1 to (n−1).

The first to n-th LDs have first to n-th oscillation wavelengths with first to n-th wavelength differences from the first to n-th gain peak wavelengths, respectively. The first to n-th wavelength differences are within a specific acceptable range for low threshold currents and low wavelength chirping of the first to n-th LDs.

Preferably, the specific range for low threshold currents and low wavelength chirping of the first to n-th LDs is ±10 nm from a specific value.

Preferably, each of the first to n-th wavelength differences is negative and has an absolute value of 20 nm or less.

With the LD array according to the first aspect of the present invention, the first to n-th guiding layers of the first to n-th LDs have the first to n-th diffraction gratings with the first to n-th periods, respectively. Therefore, the first to n-th oscillation wavelengths of the first to n-th LDs have values corresponding to the first to n-th periods of the gratings, respectively. In other words, the first to n-th oscillation wavelengths have the relationship that the (k+1)-th oscillation wavelength is equal to the sum of the k-th oscillation wavelength and a wavelength increment, where k is an integer ranging from 1 to (n−1).

On the other hand, the first to n-th gain peak wavelengths of the first to n-th active layers have the relationship that the (k+1)-th gain peak wavelength is equal to the sum of the k-th gain peak wavelength and the corresponding wavelength increment.

Further, the first to n-th wavelengths differences of the first to n-th oscillation wavelengths from the corresponding first to n-th gain peak wavelengths are within the specific range for low threshold currents and low wavelength chirping of the first to n-th LDs.

As a result, the first to n-th LDs have approximately a same lasing characteristic independent of an oscillation wavelength span of the first to n-th LDs. This means that the lasing characteristic fluctuation of the first to n-th LDs is limited within the specific acceptable range for low threshold currents and low wavelength chirping of the first to n-th LDs independent of an oscillation wavelength span of the first to n-th LDs.

According to a second aspect of the present invention, another LD array is provided. This LD array is comprised of a semiconductor substrate, first to n-th single-axial-mode LDs arranged on the substrate, and first to n-th optical modulators Arranged on the substrate to be optically coupled with the first to n-th LDs, respectively, where n is an integer equal to or greater than 2. The first to n-th LDs are located in an LD region of the substrate. The first to n-th optical modulators are located in a modulator region of the substrate.

First to n-th stripe-shaped semiconductor active layers are formed on or over the substrate. First to n-th stripe-shaped semiconductor guiding layers are formed on one side of the first to n-th active layers, respectively. First to n-th stripe-shaped semiconductor cladding layers are formed on the other side of the first to n-th active layers, respectively.

Parts of the first to n-th active layers, parts of the first to n-th guiding layers, and parts of the first to n-th cladding layers are located in the LD region of the substrate to constitute the first to n-th LDs, respectively.

Parts of the first to n-th active layers, parts of the first to n-th guiding layers, and parts of the first to n-th cladding layers are located in the modulator region of the substrate to constitute the first to n-th optical modulators, respectively.

The parts of the first to n-th guiding layers located in the LD region of the substrate have first to n-th diffraction gratings with first to n-th periods, respectively The first to n-th periods have a relationship that the (k+1)-th period is equal to a sum of the k-th period and a period increment, where k is an integer ranging from 1 to (n−1).

The period increment for two adjacent ones of the first to n-th gratings may be constant or variable.

The parts of the first to n-th active layers located in the LD region of the substrate have first to n-th oscillation wavelengths, respectively.

The parts of the first to n-th active layers located in the modulator region of the substrate have first to n-th optical-absorption edge wavelengths, respectively. The first to n-th optical-absorption edge wavelengths have a relationship that (k+1)-th optical-absorption edge wavelength is equal to a sum of the k-th optical-absorption edge wavelength and a wavelength increment.

The first to n-th oscillation wavelengths of the first to n-th LDS have first to n-th wavelength differences from the first to n-th optical-absorption edge wavelengths of the first to n-th optical modulators, respectively. The first to n-th wavelength differences are within a specific acceptable range for proper optical outputs and proper optical extinction ratios of the firsts to n-th optical modulators.

Preferably, the specific acceptable range for proper optical outputs and proper optical extinction ratios of the first to n-th optical modulators is ±15 nm of a specific value.

Preferably, each of the first to n-th wavelength differences is 50 nm to 80 nm.

With the LD array according to the second aspect of he present invention, the parts of the first to n-th guiding layers in the LD region of the substrate have the first to n-th diffraction gratings with the first to n-th periods, respectively. Therefore, the first to n-th oscillation wavelengths of the first to n-th LDs have values corresponding to the first to n-th periods of the gratings, respectively. In other words, the first to n-th oscillation wavelengths have the relationship that the (k+1)-th oscillation wavelength is equal to the sum of the k-th oscillation wavelength and a wavelength increment, where k is an integer ranging from 1 to (n−1).

On the other: hand, the first to n-th optical-absorption edge wavelength in the modulator region of the substrate have the relationship that the (k+1)-th optical-absorption edge wavelength is equal to the sum of the k-th optical-absorption edge wavelength and the corresponding wavelength increment.

Further, the first to n-th wavelengths differences of the first to n-th oscillation wavelengths from the corresponding first to n-th optical-absorption edge wavelengths are within the specific acceptable range for proper optical outputs and proper optical extinction ratios of the first to n-th optical modulators.

As a result, the first to n-th optical modulators have approximately a same modulation characteristic independent of an oscillation wavelength span of the first to n-th LDs. This means that the modulation characteristic fluctuation of the first to n-th modulators is limited within the specific acceptable range for proper optical outputs and proper optical extinction ratios of the first to n-th optical modulators independent of an oscillation wavelength span of the first to n-th LDs.

According to a third aspect of the present invention, a fabrication method of the LD array according to the first aspect is provided.

This method is comprised of the steps of (a) forming first to n-th stripe-shaped semiconductor active layers on or over a semiconductor substrate, (b) forming first to n-th stripe-shaped semiconductor guiding layers on one side of the first to n-th active layers, respectively, and (c) forming first to n-th stripe-shaped semiconductor cladding layers on the other side of the first to n-th active layers, respectively, where n is an integer equal to or greater than 2.

The first to n-th guiding layers have first to n-th diffraction gratings with first to n-th periods, respectively. The first to n-th periods have a relationship that the (k+1)-th period is equal to a sum of the k-th period and a period increment, where k is an integer ranging from 1 to (n−1).

The first to n-th active layers, the first to n-th guiding layers, and the first to n-th cladding layers constitute first to n-th single-axial-mode LDs, respectively.

The steps (a), (b), and (c) are successively performed by selective epitaxial growth using a same dielectric mask. The dielectric mask has first to n-th stripe-shaped open windows and first to n-th pairs of stripe-shaped masking regions located at each side of the first to n-th windows, respectively. The first to n-th active layers, the first to n-th guiding layers and the first to n-th cladding layers are selectively grown in the first to n-th windows of the mask, respectively.

The first to n-th pairs of the masking regions of the mask have first to n-th widths, respectively. The first to n-th widths have a relationship that the (k+1)-th width is equal to a sum of the k-th width and a width increment, where k is an integer ranging from 1 to (n−1).

The first to n-th LDs have first to n-th oscillation wavelengths with first to n-th differences from the first to n-th gain peak wavelengths, respectively. Each of the first to n-th differences is within a specific range for low threshold currents and low wavelength chirping of the first to n-th LDs.

With the fabrication method according to the third aspect of the present invention, the first to n-th active layers, the first to n-th guiding layers, and the first to n-th cladding layers are formed by the selectively epitaxial growth using the dielectric mask with the first to n-th stripe-shaped open windows and the first to n-th pairs of stripe-shaped masking regions. Therefore, the first to n-th active layers may have first to n-th gain peak wavelengths with a relationship that the (k+1)-th gain peak wavelength is equal to a sum of the k-th gain peak wavelength and a wavelength increment.

As a result, the LD array according to the first aspect of the present invention is fabricated.

According to a fourth aspect of the present invention, a fabrication method of the LD array according to the second aspect is provided.

This method is comprised of the steps of (a) forming first to n-th stripe-shaped semiconductor active layers for first to n-th LDs and first to n-th optical modulators on or over a semiconductor substrate, (b) forming first to n-th stripe-shaped semiconductor guiding layers for the first to n-th LDs and the first to n-th modulators on one side of the first to n-th active layers, respectively, and (c) forming first to n-th stripe-shaped semiconductor cladding layers for the first to n-th LDs and the first to n-th modulators on the other side of the first to n-th active layers, respectively, where n is an integer equal to or greater than 2.

Parts of the first to n-th guiding layers in the LD region of the substrate have first to n-th diffraction gratings with first to n-th periods, respectively. The first to n-th periods have a relationship that the (k+1)-th period is equal to a sum of the k-th period and a first increment, where k is an integer ranging from 1 to (n−1).

The steps (a), (b), and (c) are successively performed by selective epitaxial growth using a same dielectric mask. The dielectric mask has first to n-th stripe-shaped open windows and first to n-th pairs of stripe-shaped masking regions respectively located at each side of the first to n-th windows.

Parts of the first to n-th pairs of the masking regions of the mask in the modulator regions have first to n-th widths, respectively. The first to n-th widths have a relationship that the (k+1)-th width is equal to a sum of the k-th width and a width increment, where k is an integer ranging from 1 to (n−1).

The first to n-th active layers, the first to n-th guiding layers, and the first to n-th cladding layers for the first to n-th LDs and the first to n-th modulators are selectively grown in the first to n-th windows of the mask, respectively.

Parts of the first to n-th active layers, parts of the first to n-th guiding layers, and parts of the first to n-th cladding layers in the LD region of the substrate constitute the first to n-th single-axial-mode LDs, respectively.

Parts of the first to n-th active layers, parts of the first to n-th guiding layers, and parts of the first to n-th cladding layers in the modulator region of the substrate constitute the first to n-th optical modulators, respectively.

The first to n-th LDs have first to n-th oscillation wavelengths with first to n-th differences from the first to n-th optical-absorption edge wavelengths, respectively. Each of the first to n-th differences is within a specific range for satisfactory optical outputs and satisfactory optical extinction ratios of the first to n-th optical modulators.

With the fabrication method according to the fourth aspect of the present invention, the first to n-th active layers, the first to n-th guiding layers, and the first to n-th cladding layers are successively formed by the selectively epitaxial growth using the dielectric mask with the first to n-th stripe-shaped windows and the first to n-th pairs of stripe-shaped masking regions. Therefore, the parts of the first to n-th active layers in the modulator region of the substrate have first to n-th optical-absorption edge wavelengths, respectively. The first to n-th optical-absorption edge wavelengths have a relationship that the (k+1)-th optical-absorption edge wavelength is equal to a sum of the k-th optical-absorption edge wavelength and a wavelength increment.

As a result, the LD array according to the second aspect of the present invention is fabricated.

In a preferred embodiment of the method according to the fourth aspect, parts of the first to n-th pairs of the masking regions of the mask in the LD region of the substrate have first to n-th widths, respectively. The first to n-th widths of the parts of the pairs of the masking regions in the LD region have a relationship that the (k+1)-th width of the parts of the masking regions is equal to a sum of the k-th width and a width increment.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to the drawings attached.

First Embodiment

Figure 1:
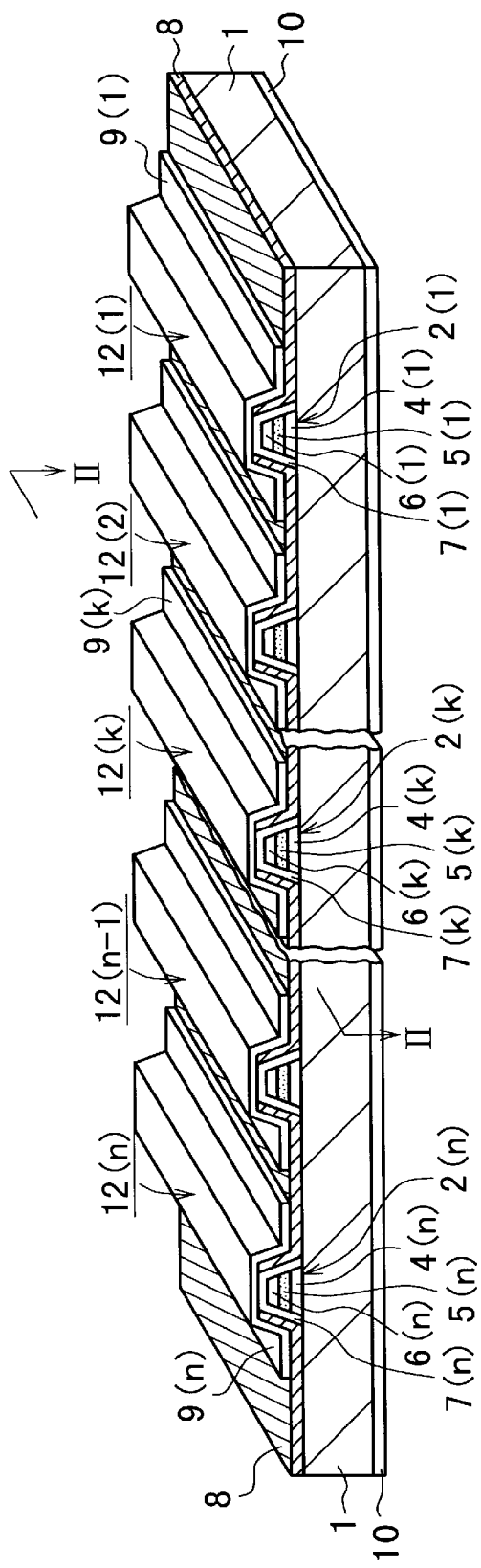
FIG. 1 is a schematic, perspective view of an LD array according to a first embodiment of the present invention.
Figure 2:
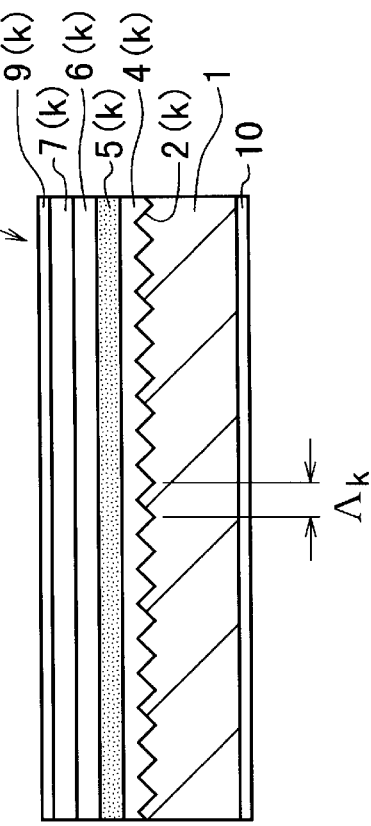
FIG. 2 is a schematic, cross-sectional view along the line II—II in FIG. 1.

An LD array according to a first embodiment of the present invention is shown in FIGS. 1 and 2. This LD array is comprised of an n-type InP substrate 1 and first to n-th single-axial-mode LDs 12(1) to 12(n) arranged on an upper main surface of the substrate 1, where n is an integer equal to or greater than 2. These LDs 12(1) to 12(n), which have the same geometrical shape and different oscillation wavelengths within the so-called 1.55 $\mu$m region, are arranged in parallel at an interval of 250 $\mu$m. The number n is set as, for example, 16.

The first to n-th LDs 12(1) to 12(n) include first to n-th stripe-shaped, n-type InGaAsP guiding layers 4(1) to 4(n) (0.1 $\mu$m in thickness) formed on the upper main surface of the substrate 1, first to n-th stripe-shaped InGaAsP/InGaAsP active layers 5(1) to 5(n) (0.1 $\mu$m in thickness) formed on the first to n-th guiding layers 4(1) to 4(n), respectively, and first to n-th stripe-shaped, p-type InP cladding layers 6(1) to 6(n) (0.2 $\mu$m in thickness) formed on the first to n-th active layers 5(1) to 5(n), respectively.

The first to n-th stripe-shaped guiding layers 4(1) to 4(n), the first to n-th stripe-shaped active layers 5(1) to 5(n), and the first to n-th stripe-shaped cladding layers 6(1) to 6(n) constitute first to n-th ridge structures extending in parallel on the substrate 1, respectively. The first to n-th ridge structures extend along the [011] direction of the substrate 1 at an interval of 250 $\mu$m. The first to n-th ridge structures have the same bottom width of 1.5 $\mu$m.

First to n-th stripe-shaped, p-type InP burying layers 7(1) to 7(n) (1.5 $\mu$m in thickness) are formed to bury the first to n-th ridge structures, respectively. Each of the burying layers 7(1) to 7(n) covers the top surface and both side surfaces of a corresponding one of the first to n-th ridge structures. Therefore, the upper main surface of the substrate 1 is exposed from the burying layers 7(1) to 7(n) except for the areas for the first to n-th ridge structures.

A silicon dioxide (SiO$_2$) layer 8 is formed on the substrate 1 in such a way that the layer 8 is contacted with the side surfaces of the burying layers 7(1) to 7(n) and the exposed areas of the substrate 1 and that the top surfaces of the burying layers 7(1) to 7(n) is exposed from the layer 8.

First to n-th-upper metal electrodes 9(1) to 9(n) for the first to n-th LDs 12(1) to 12(n) are formed on the SiO$_2$ layer 8 to be contacted with the burying layers 7(1) to 7(n) at the tops of the first to n-th ridge structures, respectively. Thus, these electrodes 9(1) to 9(n) are electrically connected to the burying layers 7(1) to 7(n), respectively, and electrically insulated from the substrate 1.

A common lower metal electrode 10 for the first to n-th LDs 12(1) to 12(n) is formed on a lower main surface of the substrate 1. The electrode 10 is electrically connected to the substrate 1.

The first to n-th guiding layers 4(1) to 4(n) have the same bandgap wavelength of 1.2 μm. They have first to n-th phase-shifting type diffraction gratings 2(1) to 2(n) with first to n-th periods or pitches Λ, to Λn ranging from 237.0 to 242.0 nm at their interfaces with the substrate 1, respectively. The first to n-th periods or pitches $\Lambda_1$ to $\Lambda_n$ have a relationship that the (k+1)-th period $\Lambda_{k+1}$ is equal to a sum of the k-th period $\Lambda_k$ and a constant increment ΔΛ, where k is an integer ranging from 1 to (n−1). In other words, any two adjacent ones of the first to n-th gratings 2(l) to 2(n) have a same period difference of ΔΛ. Here, ΔΛ=0.33 nm.

The period increment ΔΛ is set as constant in this embodiment. However, this increment ΔΛ is variable for the first to n-th periods or pitches $\Lambda_1$ to $\Lambda_n$.

Each of the first to n-th active layers 6(1) to 6(n) has a Multiple-Quantum Well (XQW) stracture having five quantum wells, which is formed by InGaAsP well sublayers and InGaAsP barrier sublayers. The bandgap wavelength of the first to n-th active layers 6(1) to 6(n) varies from 1.54 to 1.57 μm corresponding to the periods $\Lambda_1$ to $\Lambda_n$ (237.0 to 242.0 nm) of the gratings 2(1) to 2(n), respectively.

The first to n-th active layers 6(l) to 6(n) have first to n-th gain peak wavelengths $\lambda_{g1}$ to $\lambda_{gn}$, respectively. The (k+1)-th gain peak wavelength $\lambda_{g(k+1)}$ is equal to a sum of the k-th gain peak wavelength $\lambda_{gk}$ and a wavelength increment Δλ. In other words, any two adjacent ones of the first to n-th active layers 6(1) to 6(n) have a same wavelength difference of Δλ.

The first to n-th single-mode LDs 12(1) to 12(n) have first to n-th oscillation wavelengths $\lambda_{dfb1}$ to $\lambda_{dfbn}$ with first to n-th wavelength differences from the first to n-th gain peak wavelengths $\lambda_{g1}$ to $\lambda_{gn}$, respectively. The first to n-th wavelength differences (i.e., the detuning) $(\lambda_{dfb1}-\lambda_{g1})$ to $(\lambda_{dfbn}-\lambda_{gn})$ are set to be negative and to have an absolute value of 20 nm or less, which is an acceptable range for low threshold currents and low wavelength chirping of the first to n-th LDs 12(1) to 12(n). Thus, the detuning between the oscillation wavelength and the gain peak wavelength is set as negative.

The LD array according to the first embodiment shown in FIGS. 1 and 2 is fabricated by the following process sequence. Here, only three ones (i.e., the (k−1)-th, k-th, and (k+1)-th ones) of the first to n-th LDs 12(1) to 12(n) are explained for the sake of simplification.

Figure 3A:
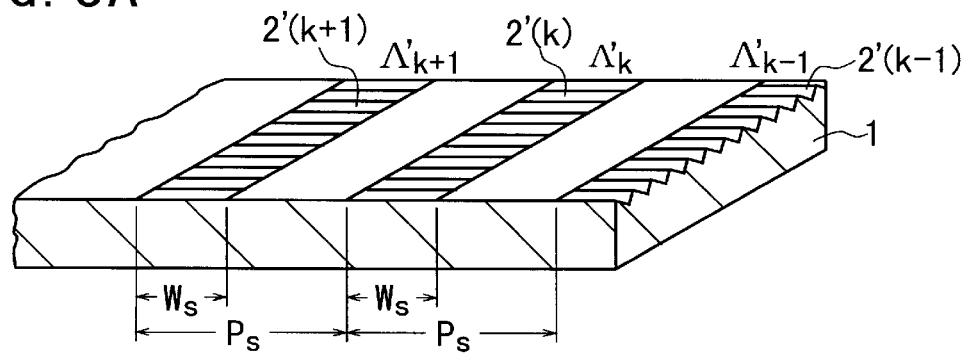
FIGS. 3A to 3E are schematic, partial, perspective view of the LD array according to the first embodiment in FIG. 1, respectively, which show the fabrication process sequence of this array.

First, as shown in FIG. 3A, the (k−1)-th, k-th, and (k+1)-th phase-shifting type diffraction gratings 2'(k−1), 2'(k), and 2'(k+1) are formed on the upper main surface of the n-type InP substrate 1 by using popular electron-beam (EB) lithography and etching techniques. These stripe-shaped gratings 2'(k−1), 2'(k), and 2'(k+1) are used for forming the gratings of the guiding layers 4 in a subsequent process.

The diffraction gratings 2'(k−1), 2'(k), and 2'(k+1) which have the same stripe shape with a width of $W_s$, (here, $W_s$=10 μm) are arranged in parallel at an interval of $P_s$ (here, $P_s$=250 μm) to extend along the [011] direction of the substrate 1. The gratings 2'(k−1), 2'(k), and 2'(k+1) have different pitches $\Lambda_{k-1}'$, $\Lambda_k'$, and $\Lambda_{k+1}'$, respectively. The (k+1) -th period $\Lambda_{k+1}'$ is equal to a sum of the k-th period $\Lambda_k'$ and a constant increment ΔΛ'. Similarly, the k-th period $\Lambda_k'$ is equal to a sum of the (k−1)-th period $\Lambda_k'$ and the same increment ΔΛ'. Here, $\Lambda_1$=237.0 nm, $\Lambda_n$=242.0 nm, and ΔΛ'=0.33 nm.

Figure 3B:
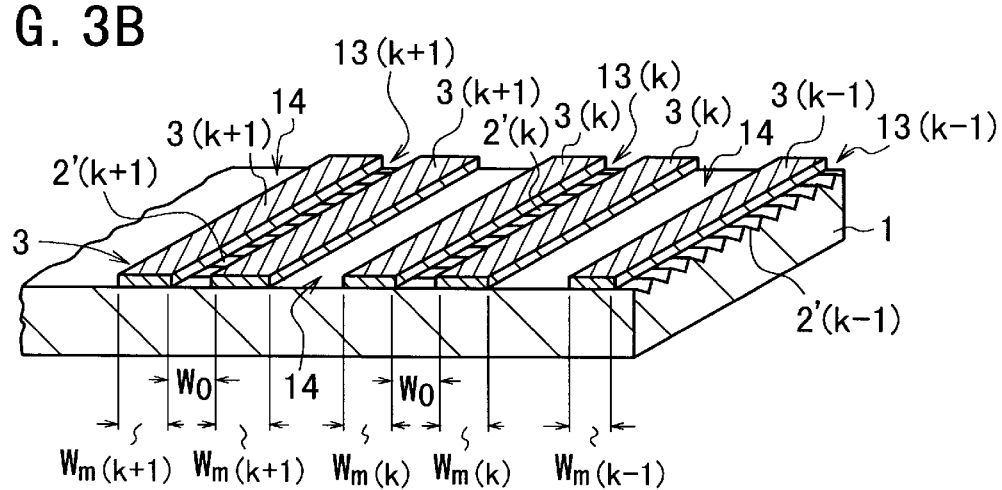

Next, as shown in FIG. 3B, a patterned SiO₂ layer 3 with a thickness of 0.1 μm is formed on the upper main surface of the substrate 1 as a mask for selective growth by a chemical vapor deposition (CVD) process. The SiO₂ mask 3 has stripe-shaped open windows 13(k−1), 13(k), and 13(k+1) and corresponding pairs of stripe-shaped masking regions 3(k−1), 3(k), and 3(k+1). The (k−1)-th pair of masking regions 3(k−1) are located at each side of the (k−1)-th open window 13(k−1). Similarly, the k-th pair of masking regions 3k are located at each side of the k-th open window 13k. The (k+1)-th pair of masking regions 3(k+1) are located at each side of the (k+1)-th open window 13(k+1).

The stripe-shaped open windows 13−1), 13(k), and 13 (k+1) are located on the corresponding gratings 2'(k−1), 2'(k), and 2'(k+1) of the substrates 1, respectively, extending along the [011] direction of the substrate 1. Intermediate areas 14 are formed between adjacent two ones of the windows 13(k−1), 13(k), and 13(k+1).

The windows 13(k−1), 13(k), and 13(k+1) have the same width W. (here, $W_o$=1.5 μm). Thee pairs of masking regions 3(k−1), 3k, and 3(k+1) have different widths corresponding to the periods of the gratings 2'(k−1), 2'(k), and 2'(k+1). Specifically, the (k−1) th pair of masking regions 3(k−1) have a width $W_{m(k-1)}$, the k-th pair of masking regions 3k have a width $W_{mk}$, the (k+1)-th pair of masking regions 3(k+1) have a width $W_{m(k-1)}$, where $W_{m(k-1)} < W_{mk} < W_{m(k+1)}$. Here, $W_{m1}$=27 μm and $W_{mn}$=33 μm.

Figure 3C:
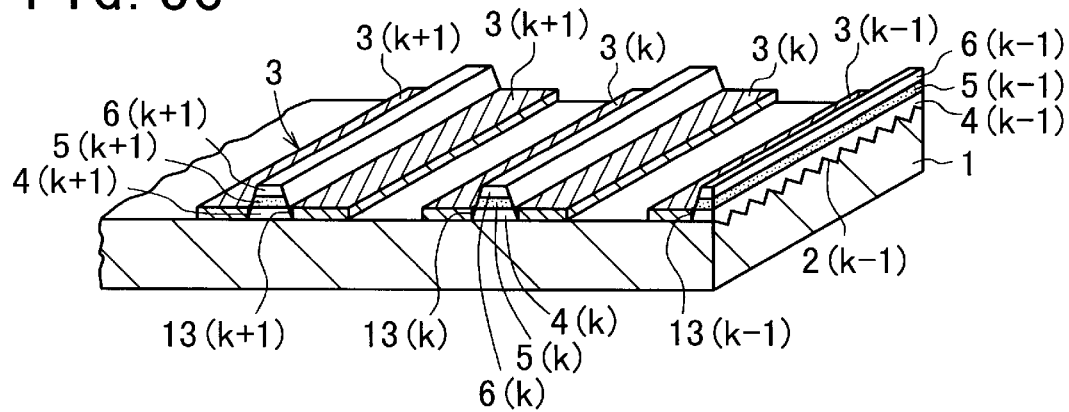

Subsequently, using the patterned Sio₂ layer 3 as a mask, the (k−1) -th, k-th, and (k+1) -th n-type InGaAsP guiding layers 4(k−1), 4(k), and 4(k+1), the (k−1)-th, k-th, and (k+1)-th InGaAsP/InGaAsP MQW active layers 5(k−1), 5(k), and 5(k+1), the (k−1)-th, k-th, and (k+1)-th p-type InP cladding layers 6(k−1), 6(k), and 6(k+1) are successively and epitaxially grown by a Meal-Organic Vapor Phase Epitaxy (MOVPE) process on the upper main surface of the substrate 1 in the respective stripe-shaped windows 13(k−1), 13(k), and 13(k+1), resulting in the (k−1)-th, k-th, and (k+1)-th ridge structures, as shown in FIG. 3C.

The (k−1)-th, k-th, -and (k+1)-th guiding layers 4(k−1), 4(k), and 4(k+1) have the above-explained diffraction gratings 2(k−1), 2(k), and 2(k+1) due to the gratings 2'(k−1), 2'(k), and 2'(k+1) on the substrate 1.

Through this MOVPE process, the active layers 5(k−1), 5(k), and 5(k+1) in the ridge structures are formed to have different thickness and different bandgap wavelengths corresponding to the widths $W_{m(k-1)}$, $W_{mk}$, and $W_{m(k+1)}$. This fact is disclosed, for example, in a paper written by T. Sasaki et al., Journal of Crystal Growth, Vol. 132, pp. 435–443, 1993.

During this selective MOVPE growth process, the same multilayer structures (not shown in FIG. 3C) as those of the ridge structures are formed on the respective intermediate areas 14, because the upper main surface of the substrate 1 is exposed from the mask 3 in the areas 14.

Figure 3D:
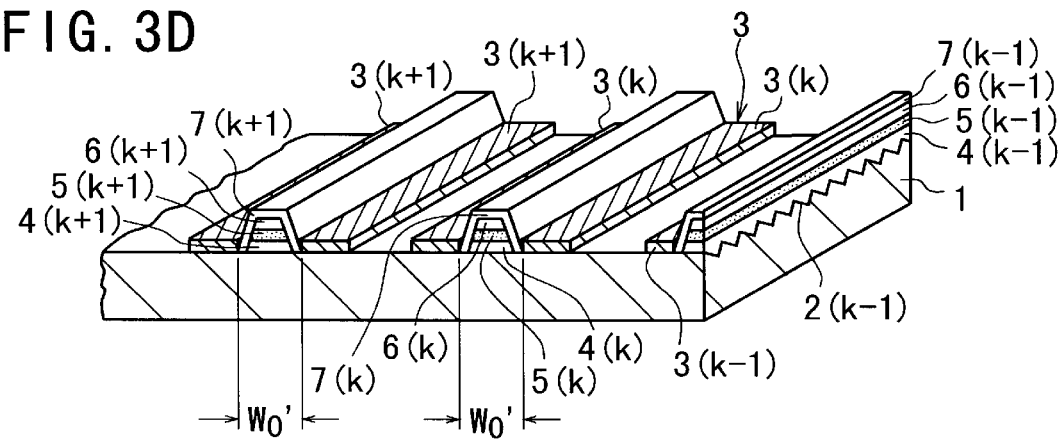

Next, the mask 3 is selectively removed to expand the windows 13(k−1), 13 (k), and 13(k+1) to a specific width $W_a'$(for example, 5 μm) by popular photolithography and etching processes. Then, the p-type InP burying layers 7(k−1), 7(k), and 7(k+1) are formed to cover the corresponding ridge structures by a selectively epitaxial growth process, as shown in FIG. 3D.

During this selective growth process, the same InP layers (not shown in FIG. 3D) as those of the InP burying layers 7(k−1), 7(k), and 7(k+1) are formed on the respective intermediate areas 14.

The unnecessary multilayer structures and the unnecessary InP layers are removed by a subsequent etching process. However, the unnecessary multilayer structures and the unnecessary InP layers may be left on the respective intermediate areas 14 of the substrate 1.

Figure 3E:
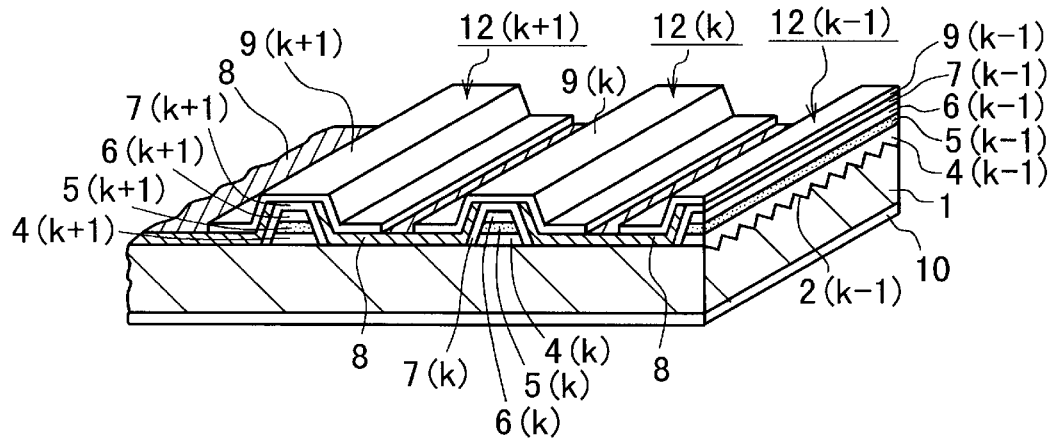

Further, the SiO$_2$ layer 8 is formed to selectively cover the ridge structures and the exposed, upper main surface of the substrate 1 by a popular CVD process, as shown in FIG. 3E.

Subsequently, as shown in FIG. 3E, the upper metal electrodes 9(k−1), 9(k), and 9(k+1) are formed on the SiO$_2$ layer 8 to be contacted with the burying layers 7(k−1), 7(k), and 7(k+1), respectively. The lower metal electrode 10 is formed on the lower main surface of the substrate 1. The upper metal electrodes 9(k−1), 9(k), and 9(k+1) are electrically insulated from each other.

Thereafter, the substrate 1 is cleaved at a specific interval (for example, 400 μm) which is equal to the LD array length. Anti-coating films (not shown) are formed on the respective cleavage planes of the substrate 1.

Thus, the LD array as shown in FIGS. 1 and 2 are fabricated.

With the LD array according to the first embodiment of the present invention, the first to n-th InGaAsP guiding layers 4(1) to 4(n) of the first to n-th LDs 12(1) to 12(n) have the first to n-th diffraction gratings 2(1) to 2(n) with the first to n-th different periods $\Lambda_1$ to $\Lambda_n$, respectively. Therefore, the first to n-th oscillation wavelengths $\lambda_{dfb1}$ to $\lambda_{dfbn}$ of the LDs 12(1) to 12(n) have values corresponding to the first to n-th periods $\Lambda_1$ to $\Lambda_n$ of the gratings 2(1) to 2(n), respectively. In other words, the first to n-th oscillation wavelengths $\lambda_{dfn1}$ to $\lambda_{dfbn}$ have a relationship that the (k+1)-th oscillation wavelength $\lambda_{dfb(k+1)}$ of the (k+1)-th LD 12(k+1) is equal to the sum of the k-th oscillation wavelength $\lambda_{dfbk}$ of the k-th LD 12(k) and the wavelength increment $\Delta\lambda_{dfb}$, where k is an integer ranging from 1 to (n−1).

On the other hand, the first to n-th gain peak wavelengths $\lambda_{g1}$ to $\lambda_{gn}$ have a relationship that the (k+1)-th gain peak wavelength $\lambda_{g(k+1)}$ of the (k+1)-th active layer 5(k+1) is equal to the sum of the k-th gain peak wavelength $\lambda_{gk}$ of the k-th active layer 5(k) and the corresponding wavelength increment $\Delta\lambda_{dfb}$, where $1 \leq k \leq (n-1)$.

Further, the first to n-th wavelength differences of the first to n-th oscillation wavelengths $\lambda_{dfb1}$ to $\lambda_{dfbn}$ from the corresponding first to n-th gain peak wavelengths $\lambda_{g1}$ to $\lambda_{gn}$ are set to be within the specific range for low threshold currents and low wavelength chirping of the first to n-th LDs 12(1) to 12(n).

As a result, the first to n-th LDs 12(1) to 12(n) have approximately a same lasing characteristic independent of an oscillation wavelength span of the LDs 12(1) to 12(n). This means that the lasing characteristic fluctuation of the LDs 12(1) to 12(n) is limited within the specific acceptable range for low threshold currents and low wavelength chirping of the LDs 12(1) to 12(n) independent of an oscillation wavelength span of the LDs 12(1) to 12(n).

The inventors fabricated the LD array with the same configuration as that according to the first embodiment and they performed confirmation tests about this array. The following results were obtained from the tests.

The number n of the LDs was set as 16, i.e., n=16. The increment $\Delta\Lambda$ of the period or pitch of the diffraction gratings 2(1) to 2(n) was set as 0.33 nm. The oscillation wavelength $\lambda_{dfg1}$ of the first LD (which corresponds to the shortest period of the diffraction grating 2(1)) was 1530 nm, and the oscillation wavelength $\lambda_{dfgn}$ of the n-th or sixteenth LD (which corresponds to the longest period of the diffraction grating 2(n)) was 1562 nm. The gain peak. wavelength $\lambda_{g1}$ of the first LD 12(1) was 1540 nm, and the gain peak wavelength $\lambda_{gn}$ the n-th or sixteenth LD 12(n) was 1575 nm. Therefore, the wavelength differences $(\lambda_{dfg1}-\lambda_{g1})$ to $(\lambda_{dfgn}-\lambda_{gn})$ i.e., the detuning, were limited to be in the range of −10 to −15 nm.

As a result, the threshold currents of the first to n-th (or sixteenth) LDs 12(1) to 12(n) were limited to be in th range of 7±1 mA. This means that the lasing characteristics of the LDs 12(1) to 12(n) were extremely uniform.

Figure 13:
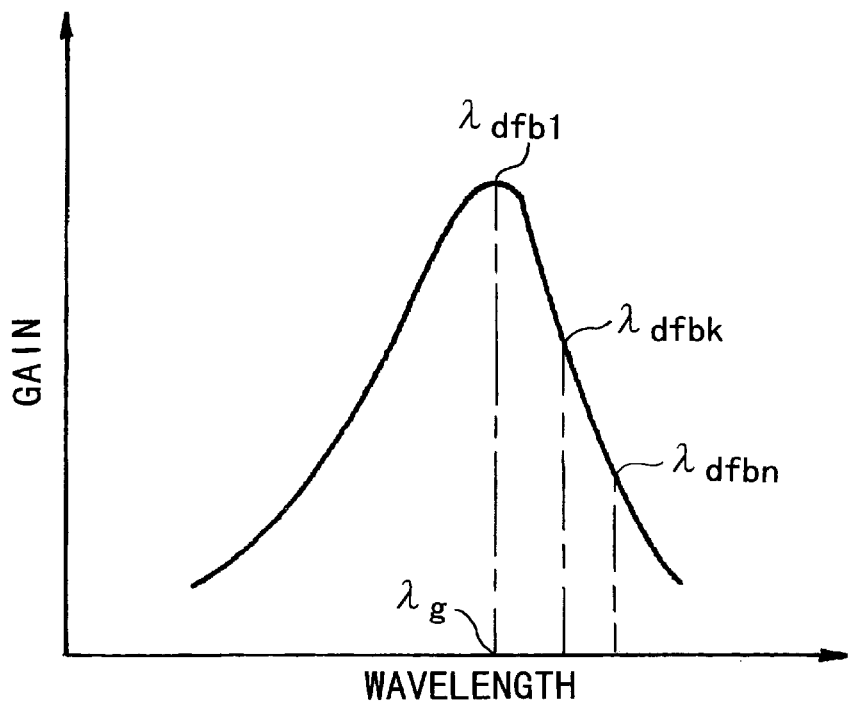
FIG. 13 is a graph schematically showing a gain spectrum of an active layer of a conventional LD array as a function of the wavelength.
Figure 14:
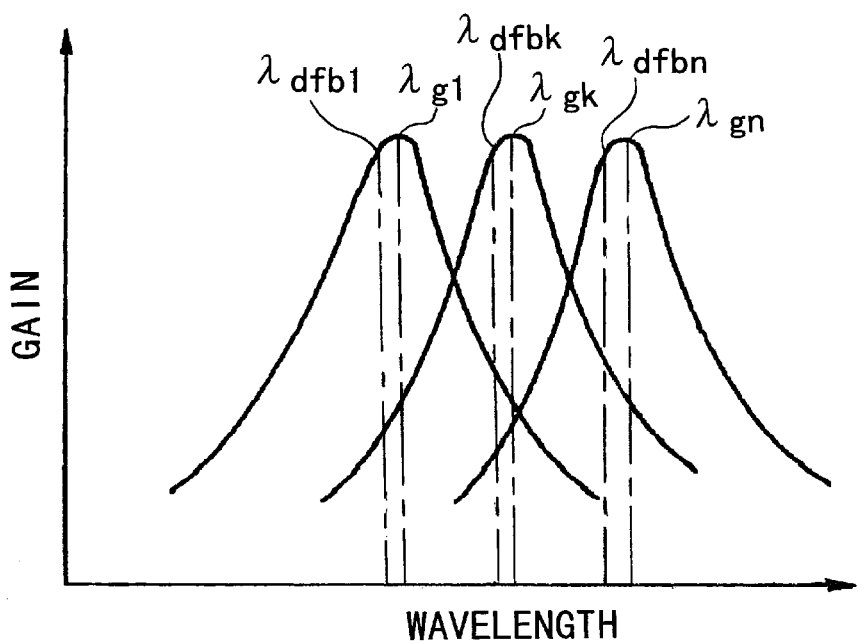
FIG. 14 is a graph schematically showing a gain spectrum of the active layers in the LD arrays according to the first and second embodiments of the present invention as a function of the wavelength.

FIG. 13 shows a gain spectrum of an active layer of the conventional LD array and FIG. 14 shows a gain spectrum of the active layer in the LD array according to the first embodiment. As seen from FIG. 13, the conventional LD array have the same gain peak wavelength $\lambda_g$ and the different oscillation wavelengths $\lambda_{dfb1}$, $\lambda_{dfbk}$, and $\lambda_{dfbn}$, resulting in a large fluctuation in LD characteristic. On the other hand, the LD according to the first embodiment have the different gain peak wavelengths $\lambda_{g1}$, $\lambda_{gk}$, and $\lambda_{gn}$ and the corresponding, different oscillation wavelengths $\lambda_{dfb1}$, $\lambda_{dfbk}$, and $\lambda_{dfbn}$. As a result, the fluctuation in LD characteristic becomes uniform.

Second Embodiment

Figure 4:
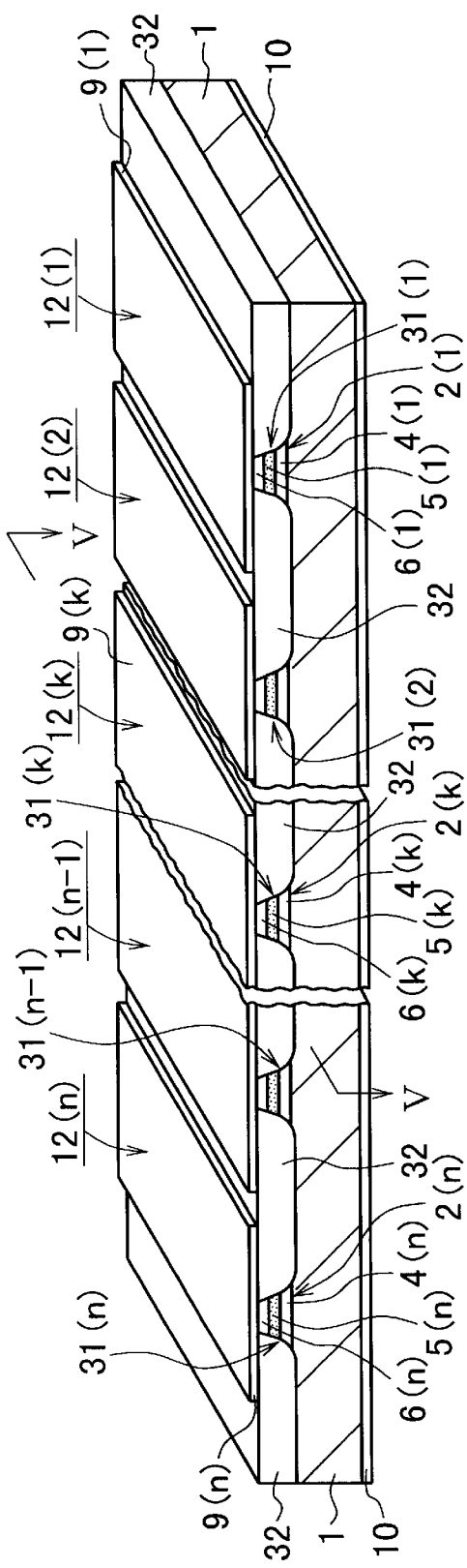
FIG. 4 is a schematic, perspective view of an LD array according to a second embodiment of the present invention.
Figure 5:
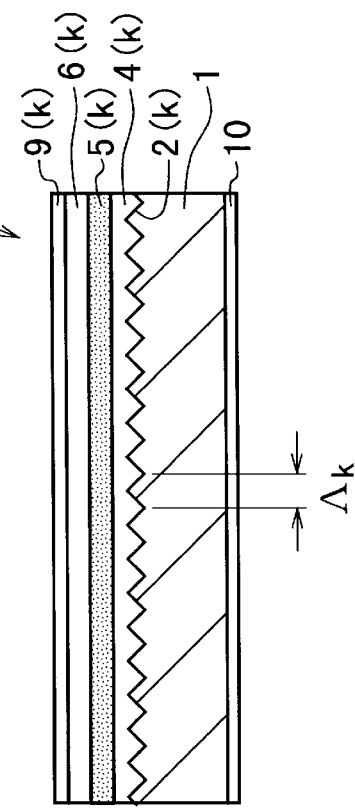
FIG. 5 is a schematic, cross-sectional view along the line V—V in FIG. 4.

An LD array according to a second, embodiment of the p sent invention is shown in FIGS. 4 and 5. This LD array ha the same configuration as that of the first embodiment in FIGS. 1 and 2, except for the shape or structure of the burying layers and the upper electrodes. Therefore the description relating the same configuration is omitted here for the sake of simplification of description by attaching the same reference numerals to the same or corresponding elements in FIGS. 4 and 5.

As shown in FIGS. 4 and 5, instead of the first to n-th ridges in the first embodiment, first to n-th mesa stripes, 31(1) to 31(n) are formed on the upper main surface of the substrate 1. An InP burying layer 32 with a high electric resistance is formed on the upper main surface of the substrate 1 to bury the first to n-th mesa stripes 31(1) to 31(n). The upper surface of the burying layer 32 is in a flat plane parallel to the substrate 1. The tops of the mesa stripes 31(1) to 31(n), i.e., the first to n-th InP cladding layers 7(1) to 7(n) are exposed from the burying layer 32.

The upper metal electrodes 12(1) to 12(n), which have a shape of a rectangular flat sheet, are formed on the burying layer 32 to be contacted with and electrically connected to the first to n-th cladding layers 7(1) to 7(n), respectively.

The LD array according to the second embodiment shown in FIGS. 4 and 5 is fabricated by the following process sequence.

Figure 6A:
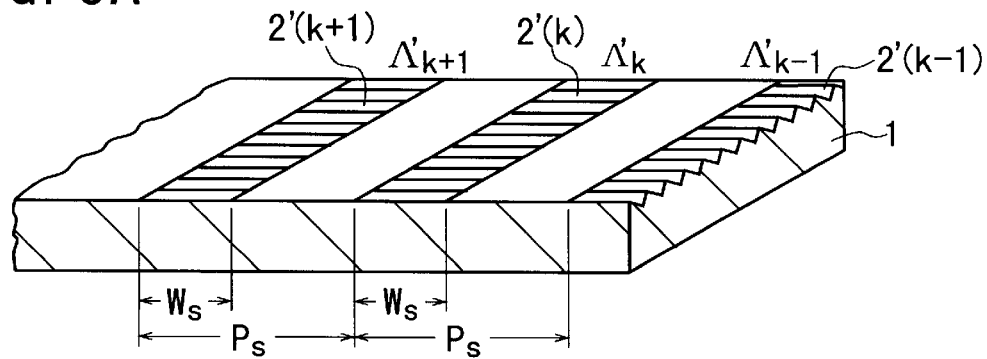
FIGS. 6A to 6E are schematic, partial, perspective view of the LD array according to the second embodiment in FIG. 4, respectively, which show the fabrication process sequence of this array.

First, as shown in FIG. 6A, the (k−1)-th, k-th, and (k+1)-th phase-shifting type diffraction gratings 2'(k−1), 2'(k), and 2'(k+1) are formed on the upper main surface of the n-type InP substrate 1 by using popular EB lithography and etching techniques. These stripe-shaped gratings 2'(k−1) 2'(k), and 2'(k+1) are used for forming the gratings of the guiding layers in a subsequent process.

The diffraction gratings 2'(k−1), 2'(k), and 2'(k+1), which have the same stripe shape with a width of W$_s$, (here, W$_s$=10 μm) are arranged in parallel at an interval of P$_s$ (here, P$_s$250 μm) to extend along the [011] direction of the substrate 1. The gratings 2'(k−1), 2'(k), and 2'(k+1) have different pitches $\Lambda_{k-1}'$, $\Lambda_k'$, and $\Lambda_{k+1}'$, respectively. The (k+1)-th period $\Lambda_{k+1}'$ is equal to a sum of the k-th period $\Lambda_k'$ and a constant increment $\Delta\Lambda'$. Similarly, the k-th period $\Lambda_k'$ is equal to a sum of the (k−1)-th period $\Lambda_k'$ and the same increment-$\Delta\Lambda'$. Here, $\Lambda_1$=237.0 nm, $\Lambda_1$=242.0 nm, and $\Delta\Lambda'$=0.33 nm.

Figure 6B:
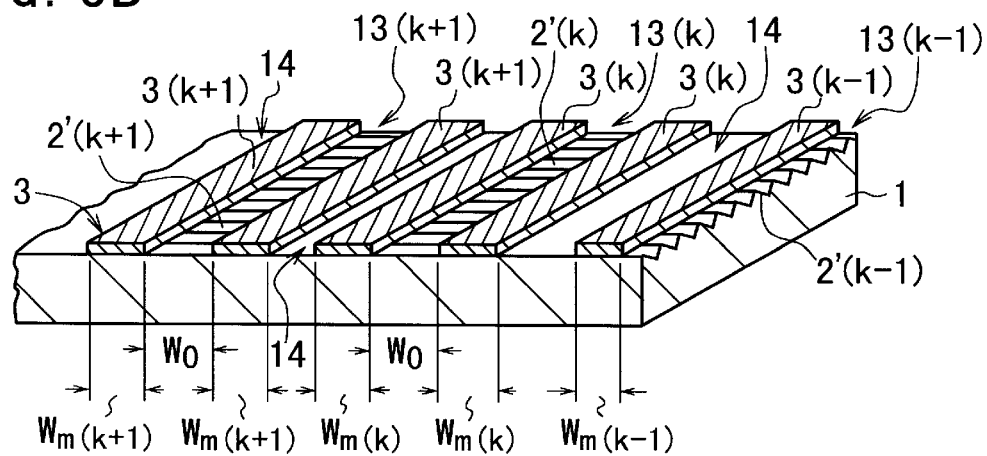

Next, as shown in FIG. 6B, a patterned SiO$_2$ layer 3 with a thickness of 0.1 μm is formed on the upper main surface of the substrate 1 as a mask for selective growth by a CVD process. The SiO$_2$ mask 3 has stripe-shaped open windows 13(k−1), 13(k), and 13(k+1) and corresponding pairs of stripe-shaped masking regions 3(k−1), 3(k), and 3(k+1). The (k−1)-th pair of masking regions 3(t−1) are located at each side of the (k−1)-th open window 13(k−1). Similarly, the k-th pair of masking regions 3k are located at each side of the k-th open window 13k. The, (k+1)-th pair of masking regions 3(k+1) are located at each side of the (k+1)-th open window 13 (k+1).

The stripe -shaped open windows 13(k−1), 13(k), and 13(k+1) are located on the corresponding gratings 2'(k−1), 2'(k), and 2'(k+l)of the substrate 1, respectively, extending along the [011] direction of the substrate 1. Intermediate areas 14 are formed between adjacent two ones of the windows 13(k−1), 13(k), and 13(k+1).

The windows 13(k−1), 13(k), and 13(k+1) have the same width $W_o$ (here, $W_o$=10 μm), which is wider than that of the first embodiment. The pairs of masking regions 3(k−1), 3k, and 3(k+1) have different widths corresponding to the periods of the gratings 2'(k−1), 2'(k), and 2'(k+1). Specifically, the (k−1)-th pair of masking regions 3(k−1) have a width $W_{m(k-1)}$, the k-th pair of masking regions 3k have a width $W_{mk}$, and the (k+1)-th pair of masking regions 3(k+1) have a width $W_{m(k+1)}$, where $W_{m(k-1)} < W_{mk} < W_{m(k+1)}$. Here, $W_{m1}$= 10 μm and $W_{mn}$=28 μm, and $W_{m2}$ to $W_{m(n-1)}$ are set to have a constant increment between $W_{m1}$ and $W_{mn}$, respectively.

Figure 6C:
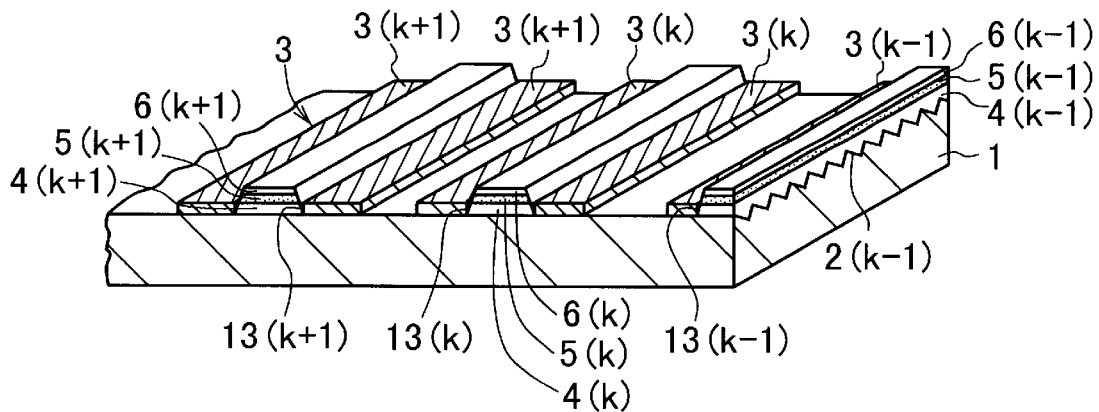

Subsequently, using the patterned $SiO_2$ layer 3 as a mask, the n-type InGaAsP guiding layers 4(k−1), 4(k), and 4(k+1), the InGaAsP/InGaAsP MQW, active layers 5(k−1), 5(k), and 5(k+1), and the p-type InP cladding layers 6(k−1), 6(k), and 6(k+1) are successively and epitaxially grown by a meal-organic vapor phase epitaxy (MOVPE) process on the upper main surface of the substrate 1 in the respective stripe-shaped windows 13(k−1), 13(k), and 13(k+1). Thus, the (k−1)-th, k-th, and (k+1)-th mesa stripes 31(k−1), 31(k), and 31(k+1) are formed, as shown in FIG. 6C.

The guiding layers 4(k−1), 4(k), and 4(k+1) have the above-explained diffraction gratings 2(k−1), 2(k), and 2(k+1) due to the gratings 2'(k−1), 2'(k), and 2'(k+1) on the substrate 1.

Through this MOVPE process, the active layers 5(k−1), 5(k), and 5(k+1) are formed to have different thickness and different bandgap wavelengths corresponding to the widths $W_{m(k-1)}$, $W_{mk}$, and $W_{m(k+1)}$ of the mask 3.

During this selective MOVPE growth process, the same multilayer structures (not shown in FIG. 6C) as those of the ridge structures are formed on the respective intermediate areas 14, because the upper main surface of the substrate 1 is exposed from the mask 3 in the areas 14.

Figure 6D:
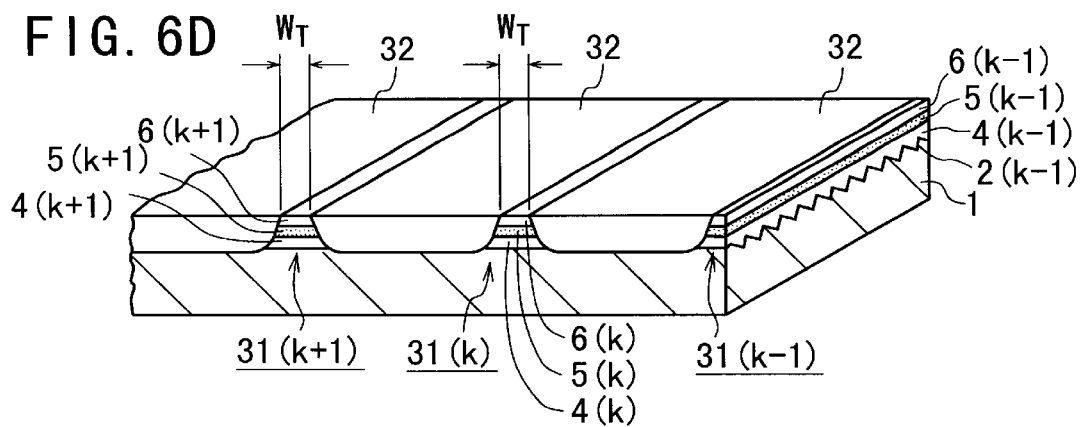

Subsequently, after the mask 3 is removed from the substrate 1, the ridge structures are etched to form the mesa stripes 31(k−1), 31(k), 31(k+1) with a same top width of 1.5 μm in the windows 13(k−1), 13(k), 13(k+1) and to overlap with the gratings 2(k−1), 2(k), and 2(k+1) by popular photolithography and etching processes, as shown in FIG. 6D. During this etching process, the unnecessary ridge structures grown on the intermediate areas 14 (not shown in FIG. 6C) are removed.

Then, the high-resistance, Fe-doped InP burying layer 32 (3 μm in thickness) is formed to cover the mesa stripes 31(k−1), 31(k), and 31(k+1) by a selectively epitaxial growth process, as shown in FIG. 6D. The tops of the stripes 31(k−1), 31(k), and 31(k+1) are exposed from the burying layer 32.

Figure 6E:
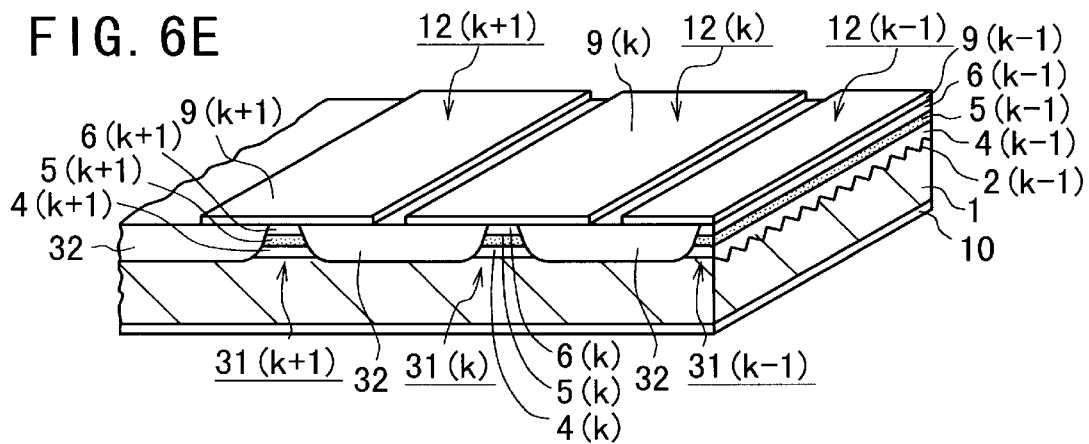

Subsequently, as shown in FIG. 6E, the upper metal electrodes 9(k−1), 9(k), and 9(k+1) are formed on the high-resistance InP burying layer 32 to be contacted with and electrically connected to the InP cladding layers 6(k−1), 6(k), 6(k+1), respectively. The lower metal electrode 10 is formed on the lower main surface of the substrate 1. The upper metal electrodes 9(k−1), 9 (k), and 9(k+1) are electrically insulated from each other.

Thereafter, the substrate 1 is cleaved at a specific interval (for example, 400 μm) which is equal to the LD array length. Anti-coating films (not shown) are formed on the respective cleavage planes of the substrate 1.

Thus, the LD array according to the second embodiment as shown in FIGS. 4 and 5 are fabricated.

With the LD array according to the second embodiment of the present invention, because of the-same reason as that of the first embodiment, the first to n-th LDs 12(1) to 12(n) have approximately a same lasing characteristic independent of an oscillation wavelength span of the LDs 12(1) to 12 (n). This means that the lasing characteristic fluctuation of the LDs 12(1) to 12(n) is limited within the specific acceptable range for low threshold currents and low wavelength chirping of the LDs 12(1) to 12(n) independent of an oscillation wavelength span of the LDs 12(1) to 12(n).

There is an additional advantage that the wavelength chirping is low, because the LDs 12(1) to 12(n) are buried by the high-resistance InP layer 32. Therefore, this LD array is capable of high-speed modulation at a rate of 5 Gb/sec or more.

The inventors fabricated the LD array with the same configuration as that according to the second embodiment and they performed confirmation tests about this array. The following results were obtained from the tests.

The number n of the LDs was set as 16, i.e., n=16. The increment ΔΛ of the period or pitch of the diffraction gratings 2(1) to 2(n) was set as 0.33 nm. The oscillation wavelength $\lambda_{dfg1}$ of the first LD (which corresponds to the shortest period of the diffraction grating) was 1530 nm, and the oscillation wavelength $\lambda_{dfgn}$ of the n-th or sixteenth LD (which corresponds to the longest period of the diffraction grating) was 1562 nm. The gain peak wavelength $\lambda_{g1}$ of the first LD was 1540 nm, and the gain peak wavelength $\lambda_{gn}$ the n-th or sixteenth LD was 1575 nm. Therefore, the wavelength differences ($\lambda_{dfg1}-\lambda_{g1}$) to ($\lambda_{dfgn}-\lambda_{gn}$ i.e., the detuning, were in the range of −10 to −15 nm, which were in the range of ±2.5 nm from 12.5 nm.

As a result, the threshold currents of the first, to n-th (or sixteenth) LDs were in the range of 6±1 mA. This means that the lasing characteristics of the LDs were extremely uniform.

Additionally, the time-average width of spectrum was 0.3 nm. This means that the wavelength chirping is low.

Although the diffraction gratings are of the phase-shifting type in the first and second embodiments, any grating of the uniform type may be used. In this case, it is necessary for a stable single-axial-mode operation that one end of each LD is coated by an AR material, and the other end. thereof is coated by a high-reflection material.

Third Embodiment

Figure 7:
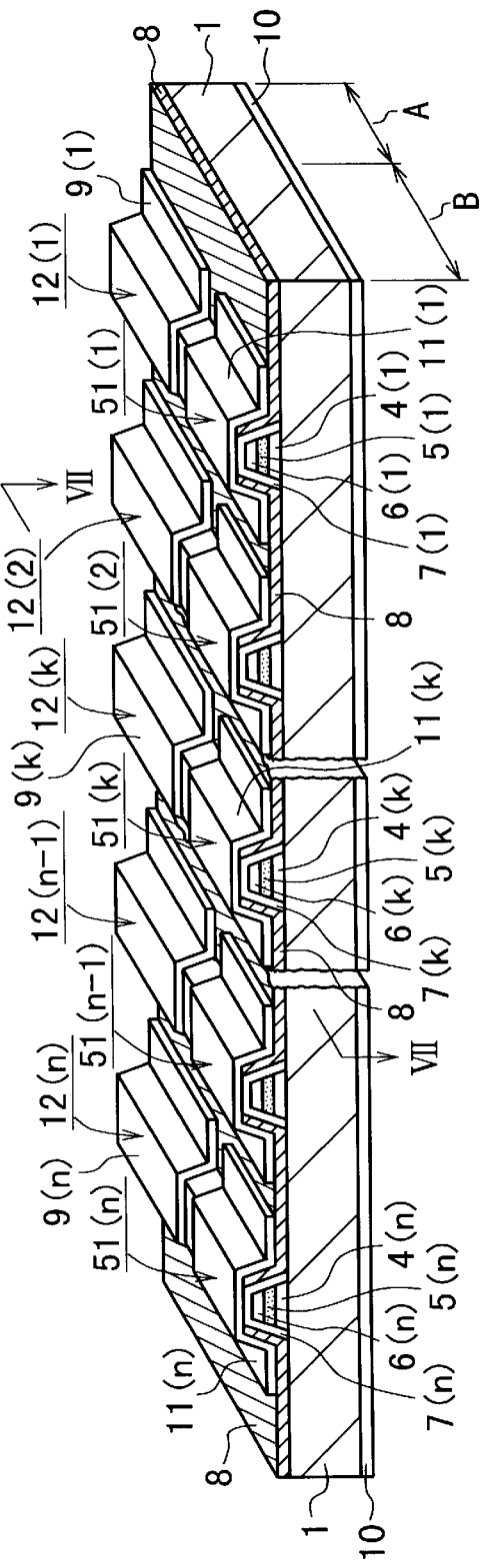
FIG. 7 is a schematic, perspective view of an LD array according to a third embodiment of the present invention.
Figure 8:
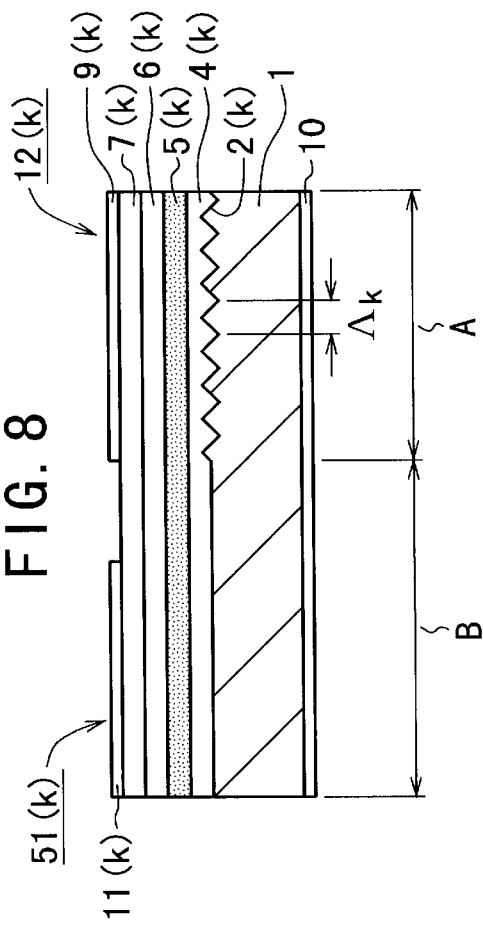
FIG. 8 is a schematic, cross-sectional view along the line VIII—VIII in FIG. 7.

An LD array according to a third embodiment of the present invention is shown in FIGS. 7 and 8. This LD array corresponds to one obtained by adding first to n-th optical modulators to the LD array according to the first embodiment. Specifically, the first to n-th LDs 12(1) to 12(n) are located in an LD region A of the substrate 1 and first to n-th optical modulators 51(1) to 52(n) are located in a modulator region B of the subtrate 1. The first to n-th optical modulators 51(1) to 52(n) are optically coupled with the first to n-th LDs 12(1) to 12(n), respectively.

Each of the first to n-th LDs 12(1) to 12(n) has the same configuration as that of the first embodiment in FIGS. 1 and 2. Therefore, the description relating the first to n-th LDs 12(1) to 12(n) is omitted here for the sake of simplification of description by attaching the same reference numerals to the same or corresponding elements in FIGS. 7 and 8.

As shown in FIGS. 7 and 8, each of the first to n-th optical modulators 51(1) to 52(n) has the same ridge structure as that of the first to n-th LDs 12(1) to 12(n) except for the diffraction gratings 2(1) to 2(n). The first to n-th ridge structures are formed to extend over the LD region A and modulator region B of the substrate 1. Therefore, the first to n-th stripe-shaped guiding layers 4(1) to 4(n), the first to n-th stripe-shaped active layers 5(1) to 5(n), the first to n-th stripe-shaped cladding layers 6(1) to 6(n), and the first to n-th stripe-shaped burying layers 7(1) to 7(n) extend over the LD region A and modulator region B.

The parts of the guiding layers 4(1) to 4(n), the active layers 5(1) to 5(n), the cladding layers 6(1) to 6(n), and the burying layers 7(1) to 7(n) of the first to n-th ridge structures in the modulator region B constitute the optical modulators 51(1) to 52(n). First to n-th upper metal electrodes 11(1) to 11(n) are respectively formed on the first to n-th burying layers 7(1) to 7(n) in the modulator region B to be electrically insulated from the first to n-th upper metal electrodes 9(1) to 9(n) in the LD region A.

The LD array according to the third embodiment shown in FIGS. 7 and 8 is fabricated by the following process sequence.

Figure 9A:
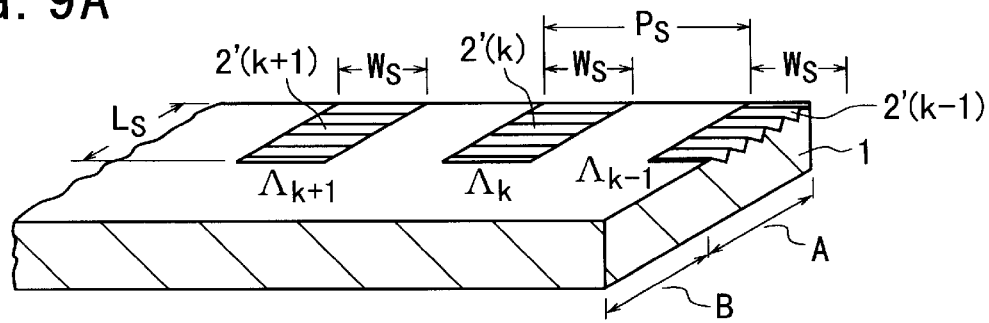
FIGS. 9A to 9E are schematic, partial, perspective view of the LD array according to the third embodiment in FIG. 7, respectively, which show the fabrication process sequence of this array.
Figure 9B:
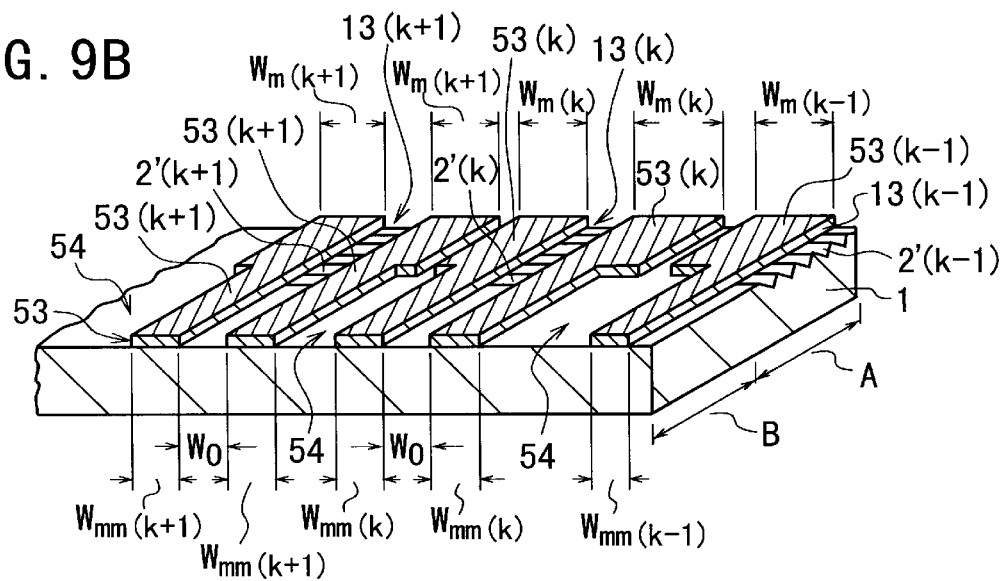
Figure 9C:
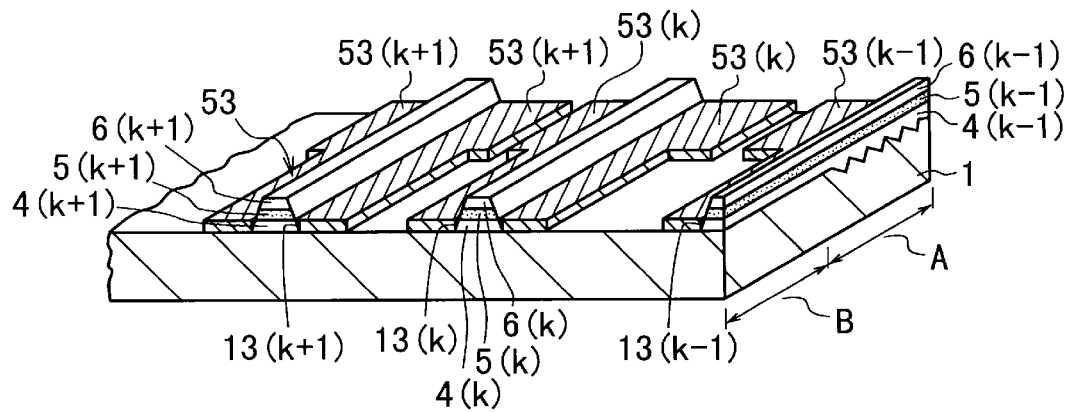

The process steps as shown in FIGS. 9A to 9C are the same as those of the first embodiment shown in FIGS. 3A to 3C, except that the diffraction gratings 2'(k–1), 2'(k), and 2'(k+1) are selectively formed in the LD region A of the substrate 1, and that a $SiO_2$ mask 53 has a different pattern from that of the mask 3 in the first embodiment.

Specifically, as shown in FIG. 9A, the gratings 2'(k–1), 2'(k) and 2'(k+1) has a length of $L_s$, which is equal to the length of the LD region A (here, $L_s$=400 µm).

As shown in FIG. 9B, the mask 53 has open windows 13(k–1), 13(k), and 13(k+1) and pairs of masking regions 53(k–1), 53(k); and 53(k+1). The open windows 13(k–1), 13(k), and 13(k+1) has a same width of $W_o$ (here, $W_o$=1.5 µm) over the LD and modulator regions A and B.

Each of the pair of masking regions 53(k–1) has a width of $W_{m(k-1)}$ in the LD region A and a width of $W_{m(k-1)}$ in the modulator region B, where $W_{m(k-1)} > W_{nm(k-1)}$. Each of the pair of masking regions 53k has a width of $W_{mk}$ in the LD region A and a width of $W_{mmk}$ in the modulator region B, where $W_{mk} > W_{mmk}$. Each of the pair of masking regions 53(k+1) has a width of $W_{m(k+1)}$ in the LD region A and a width of. $W_{(k+1)}$ in the modulator region B, where $W_{m(k-1)} > W_{,(k+1)}$.

The widths $W_{m(k-1)}$, $W_{mk}$ and $W_{m(k+1)}$ in the LD region A are the sane. The widths $W_{mm(k-1)}$, $W_{mmk}$, and $Wm_{m(k+1)}$ in the modulator region B are different, where $W_{m(k-1)} > W_{m(k+1)}$. Here, $W_{mm1}$=12 µm (at $\Lambda_1$=237.0 nm) and $W_{mmn}$=17 µm (at $\Lambda_m$=242.0 nm).

Subsequently, using the patterned $SiO_2$ layer 53 as a mask, the n-type InGaAsP guiding layers 4(k–1), 4(k), and 4(k+1), the InGaAsP/InGaAsP MQW active layers 5(k–1), 5(k), and 5(k+1), the p-type InP cladding layers 6(k–1), 6(k), and 6(k+1) are successively and epitaxially grown by an MOVPE process on the upper main surface of the substrate 1 in the respective stripe-shaped windows 13(k–1), 13(k), and 13(k+1), resulting in the (k–1)-th, k-th, and (k+1)-th ridge structures, as shown in FIG. 9C.

The parts of the (k–1)-th, k-th, and (k+1)-th guiding layers 4(k–1), 4(k), and 4(k+1) in the LD region A have the above-explained diffraction gratings 2(k–1), 2(k), and 2(k+1) due to the gratings 2'(k–1), 2'(k), and 2'(k+1) on the substrate 1.

Through this MOVPE process, the parts of the active layers 5(k–1), 5(k), and 5(k+1) in the ridge structures in the modulator region B are formed to have different thickness and different bandgap wavelengths corresponding to the widths $Wm_{m(k-1)}$, $W_{mmk}$m and $W_{mm(k+1)}$ of the masking regions.

During this selective MOVPE growth process, the same multilayer structures (not shown in Pig. 6C) as those of the ridge structures are formed on the respective intermediate areas 54, because the upper main surface of the substrate 1 is exposed from the mask 53 in the areas 14.

Figure 9D:
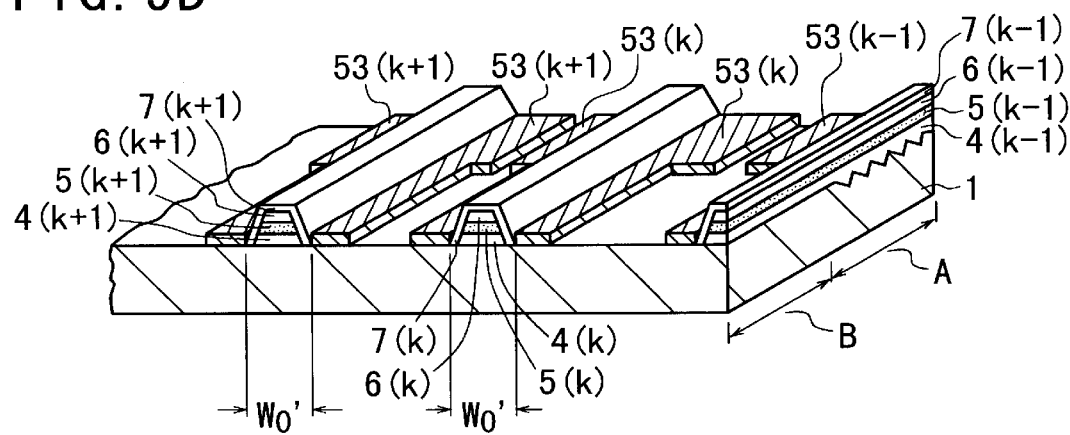

Next, the mask 53 is selectively removed to expand the windows 13(k–1), 13(k), and 13(k+1) to a specific width $W_o'$ (for example, 5 µm) by popular photolithography and etching processes. Then, the p-type InP burying layers 7(k–1), 7(k), and 7(k+1) are formed to cover the corresponding ridge structures by a selectively epitaxial growth process, as shown in FIG. 9D.

During this selective growth process, the same InP layers (not shown in FIG. 9D) as, those of the InP burying layers 7(k–1), 7(k), and 7(k+1) are formed on the respective intermediate areas 54.

The unnecessary multilayer structures and the unnecessary InP layers are removed by a subsequent etching process. However, the unnecessary multilayer structures and the unnecessary InP layers may be left on the respective intermediate areas 54 of the substrate 1.

Figure 9E:
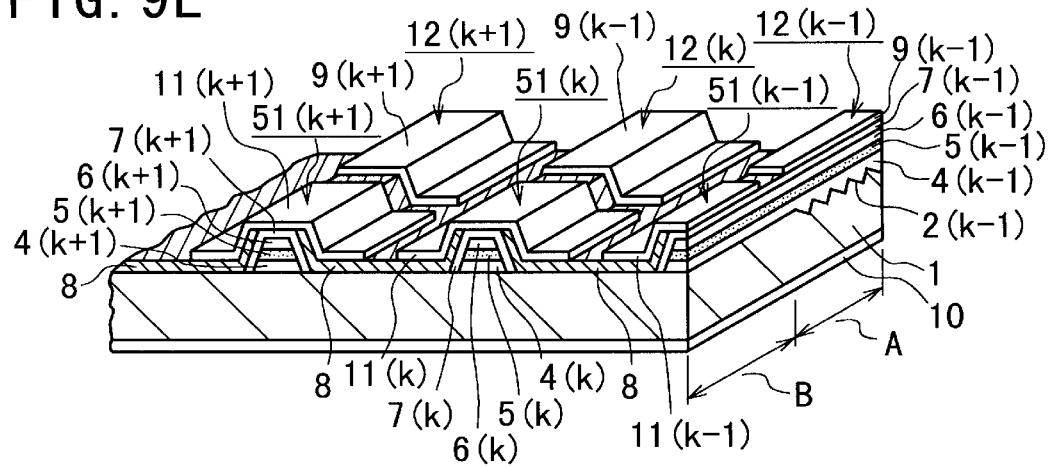

Further, the $SiO_2$ layer 8(1.5 µm in thickness) is formed to selectively cover the ridge structures and the exposed, upper main surface of the substrate 1 by a popular CVD process over the LD and modulator regions A and B, as shown in FIG. 9E.

Subsequently, as shown in FIG. 9E, the upper metal electrodes 9(k–1), 9(k), and 9(k+1) are formed on the $SiO_2$ layer 8 to be contacted with the burying layers 7(k–1), 7(k), and 7(k+1) in the LD region A, respectively. At the same time, the upper metal electrodes 11(k–1), 11(k), and 11(k+1) are formed on the $SiO_2$ layer 8 to be contacted with the burying layers 7(k–1), 7(k), and 7(k+1) in the modulator region B, respectively. The upper metal electrodes 9(k–1), 9(k), and 9(k+1) in the LD region A are electrically insulated from each other. The upper metal electrodes 11(k–1), 11(k), and 11(k+1) in the modulator region B are electrically insulated from each other.

Thereafter, the substrate 1 is cleaved at a specific interval (for example, 400 M) which is equal to the LD array length. Anti-coating films (not shown) are formed on the respective cleavage planes of the substrate 1.

Thus, the LD array as shown in FIGS. 7 and 8 are fabricated.

With the LD array according to the third embodiment of the present invention, the first to n-th guiding layers 4(1) to 4(n) of the first to n-th LDs 12(1) to 12(n) have the first to n-th diffraction gratings 2(1) to 2(n) with the first to n-th periods, respectively. Therefore, the first to n-th oscillation wavelengths of the first to n-th LDs 12(1) to 12(n) have values corresponding to the first to n-th periods of the gratings 2(1) to 2(n) in the LD region A, respectively. In other words, the parts of the first to n-th active layers 4(1) to 4(n) in the LD region A have a relationship that the (k+1)-th oscillation wavelength of the (k+1)-th LD 12(k+1) is equal to the sum of the k-th oscillation wavelength of the k-th LD and a wavelength increment, where 1≦k≦(n−1).

On the other hand, the parts of the first to n-th active layers 4(1) to 4(n) in the modulator region B have a relationship that the (k+1) th optical-absorption edge wavelength of the (k+1)-th active layer of the (k+1)-th optical modulator 51(k+1) is equal to the sum of the k-th optical-absorption edge wavelength of the k-th active layer of the k-th optical modulator 51(k) and the corresponding wavelength increment, where 1≦k≦(n−1).

Further, the first to n-th wavelengths differences of the first to n-th oscillation wavelengths from the corresponding first to n-th optical-absorption edge wavelengths are within the specific acceptable range for proper optical outputs and proper optical extinction ratios of the first to n-th optical modulators 51(1) to 52(n).

As a result, the first to n-th optical modulators 51(1) to 52(n) have approximately a same modulation characteristic independent of an oscillation wavelength span of the first to n-th LDs 12(1) to 12(n). This means that the modulation characteristic fluctuation of the first to n-th modulators 51(1) to 52(n) is limited within the specific acceptable range for proper optical outputs and proper optical extinction ratios of the first to n-th optical modulators 51(1) to 52(n) independent of an oscillation wavelength span of the first to n-th LDs 12(1) to 12(n).

The inventors fabricated the LD array with the same configuration as that in the third embodiment and they performed confirmation tests about this array. The following results were obtained from the tests.

The number n of the LDs was set as 16, i.e., n=16. The increment $\Delta\Lambda$ of the period or pitch of the diffraction gratings 2(1) to 2(n) was set as 0.33 nm. The oscillation wavelength $\lambda_{dfg1}$ of the first LD (which corresponds to the shortest period of the diffraction grating was 1530 nm, and the oscillation wavelength $\lambda_{dfgn}$ of the n-th or sixteenth LD (which corresponds to the longest period of the diffraction grating) was 1562 μm. The threshold currents of the first to n-th (or sixteenth) LDs were in the range of 10±2 mA.

The absorption-edge wavelengths $\lambda_{m1}$ and $\lambda_{mn}$ of the first to n-th modulators were 1460 nm and 1490 nm. Therefore, the wavelength differences $(\lambda_{dfg1}-\lambda_{m1})$ to $(\lambda_{dfgn}-\lambda_{mn})$, i.e., the detuning, were in the range of 60 to 75 nm. This means that the modulation characteristics of th optical modulators were extremely uniform.

The modulation voltage required for an extinction ratio of 13 dB was 2 $V_{p-p}$±0.2 V. The optical output from the modulators was 10 mW±2 mW while the injection current of 10 mA was supplied to the LDs and no bias is applied to the modulators.

The detuning fluctuation is in the range of ±7.5 nm from 67.5 nm.

Figure 15:
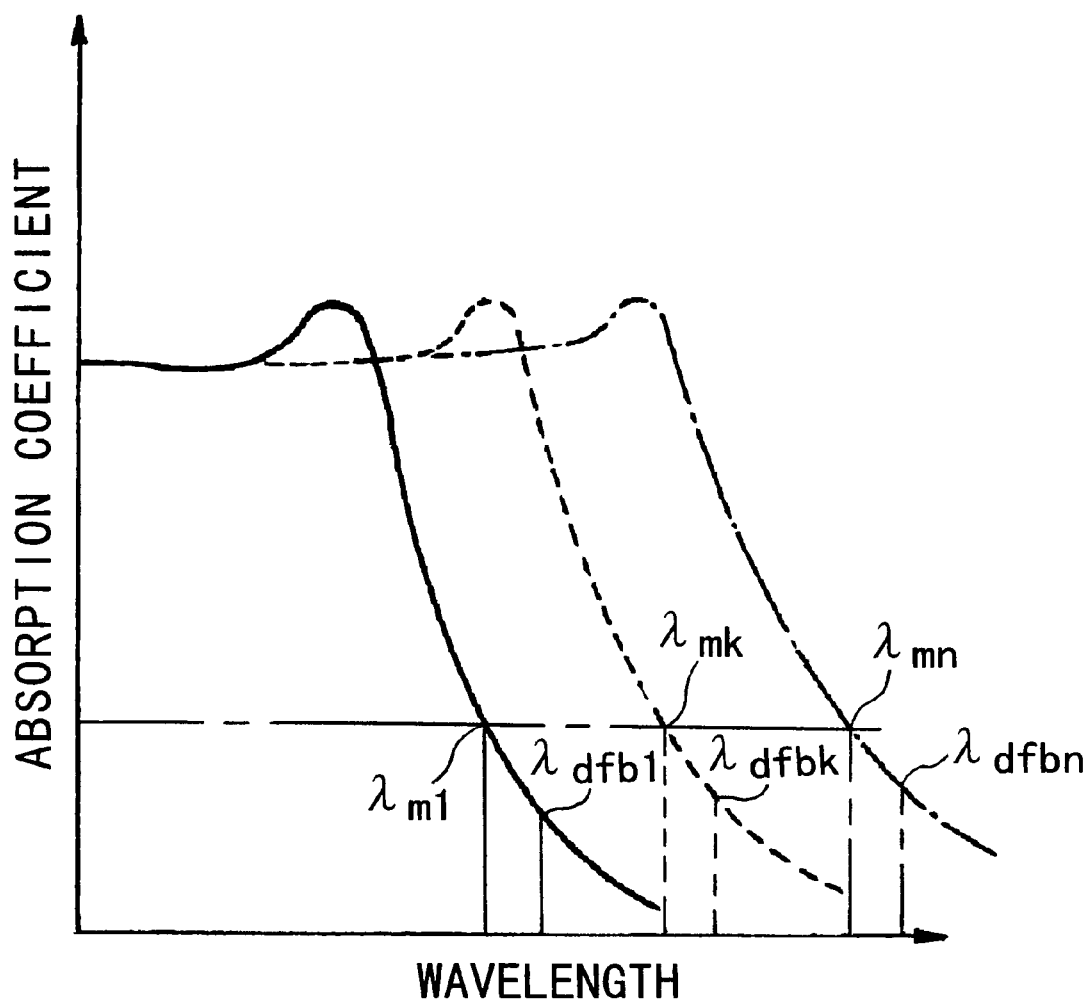
FIG. 15 is a graph schematically showing an optical absorption coefficient spectrum of the active layer of the optical modulators in the LD arrays according to the third and fourth embodiments of the present invention as a function of the wavelength.

FIG. 15 shows a gain spectrum of an active layer of the optical modulator of the LD array according to the third embodiment. As seen from FIG. 15, the LD according to the third embodiment have the different absorption-edge wavelengths $\lambda_{m1}$, $\lambda_{mk}$, and $\lambda_{mn}$ and the corresponding different oscillation wavelengths $\lambda_{dfb1}$, $\lambda_{dfbk}$, and $\lambda_{dfbn}$. As a result, the fluctuation in optical modulation characteristic becomes uniform.

Fourth Embodiment

Figure 10:
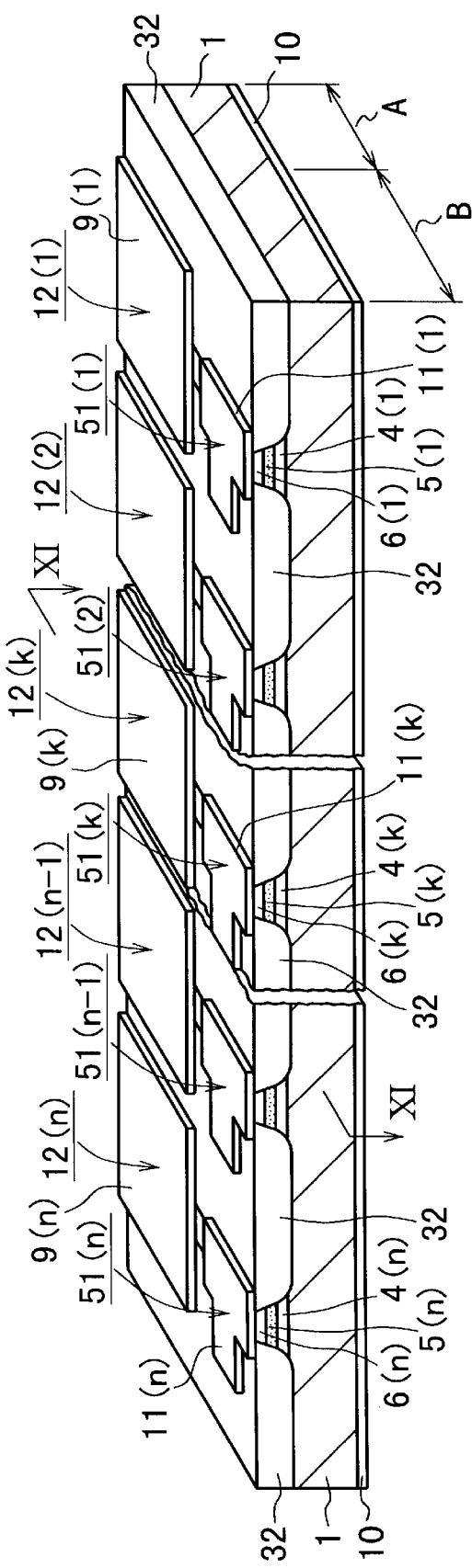
FIG. 10 is a schematic, perspective view of an LD array according to a fourth embodiment of the present invention.
Figure 11:
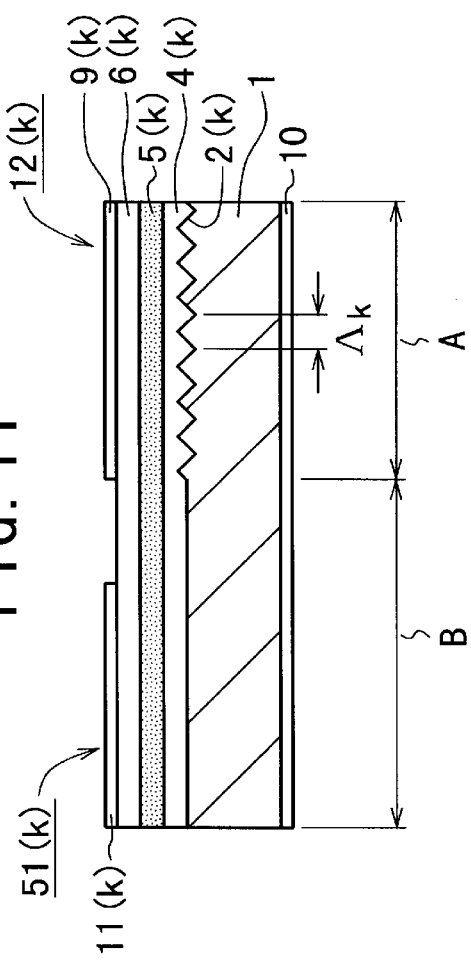
FIG. 11 is a schematic, cross-sectional view along the line XI—XI in FIG. 10.

An LD array according to a fourth embodiment of the present invention is shown in FIGS. 10 and 11. This LD array corresponds to one obtained by adding first to n-th optical modulators to the LD array according to the second embodiment. Specifically, the first to n-th LDs 12(1) to 12(n) are located in an LD region A of the substrate 1 and first to n-th optical modulators 51(1) to 52(n) are located in a modulator region B if the substrate 1. The first to n-th optical modulators 51(1) to 52(n) are optically coupled with the first to n-th LDs 12(1) to 12(n), respectively.

Each of the first to n-th LDs 12(1) to 12(n) has the same configuration that of the second embodiment in FIGS. 4 and 5. Therefore, the description relating the first to n-th LDs 12(1) to 12(n) is omitted here for the sake of simplification of description by attaching the same reference numerals to the same or corresponding elements in FIGS. 10 and 11.

As shown in FIGS. 10 and 11, each of the first to n-th optical modulators 51(1) to 52(n) has the same mesa stripe structure as that of the first to n-th LDs 12(1) to 12(n), except for the diffraction gratings 2(1) to 2(n). The first to n-th ridge structures are formed to extend over the LD region A and modulator region B of the substrate 1. Therefore,. the first to n-th stripe-shaped guiding layers 4(1) to 4(n), the first to n-th stripe-shaped active layers 5(1) to 5(n), the first to n-th stripe-shaped cladding layers 6(1) to 6(n), and the burying layer 32 extend over the LD region A and modulator region B.

The parts of the guiding layers 4(1) to 4(n), the active layers 5(1) to 5(n), the cladding layers 6(1) to 6(n), and the burying layers 7(1) to 7(n) of the first to n-th mesa stripe structures in the modulator region B constitute the optical modulators 51(1) to 52(n). First to n-th upper metal electrodes 11(1) to 11(n) are respectively formed on the burying layer 32 in the modulator region B to be electrically insulated from the first to n-th upper metal electrodes 9(1) to 9(n) in the LD region A.

The LD array according to the fourth embodiment shown in FIGS. 10 and 11 is fabricated by the following process sequence.

Figure 12A:
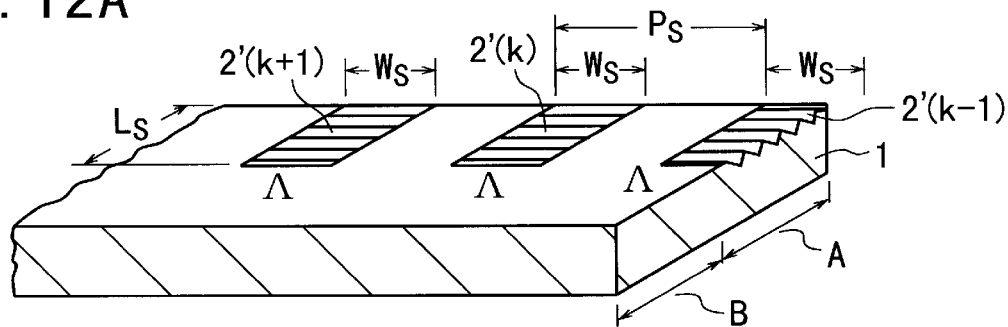
FIGS. 12A to 12E are schematic, partial, perspective view of the LD array according to the fourth embodiment in FIG. 10, respectively, which show the fabrication process sequence of this array.
Figure 12B:
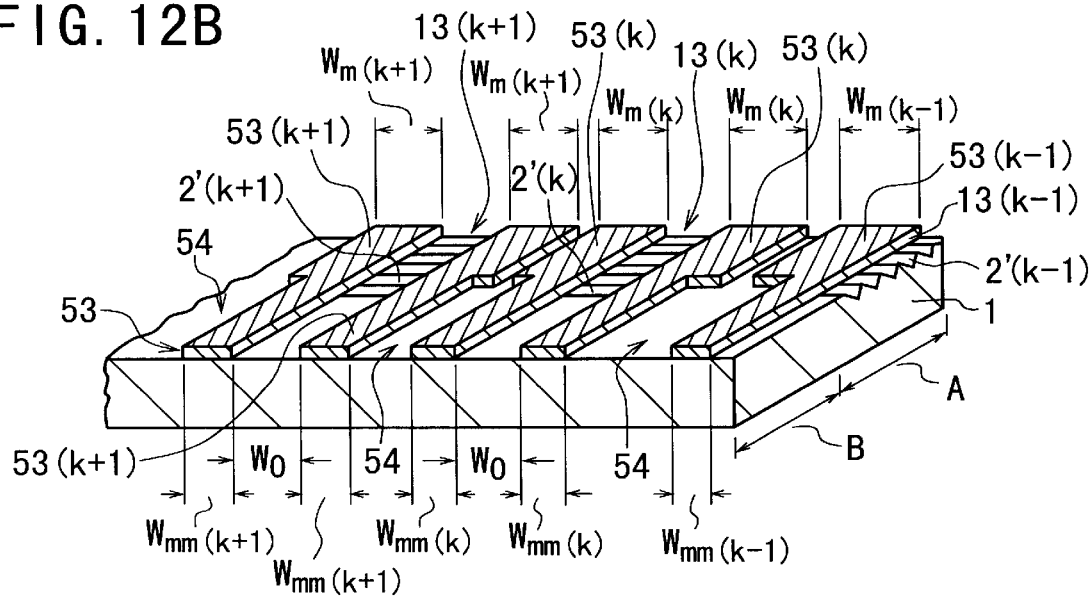
Figure 12C:
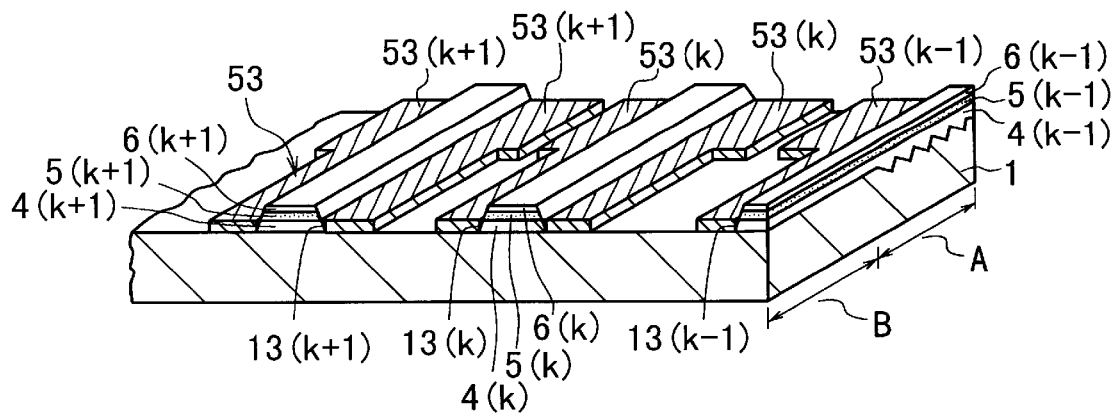

The process steps as shown in FIGS. 12A to 12C are the same as those of the second embodiment shown in FIGS. 6A to 6C, except that the diffraction gratings 2'(k−1), 2'(k), 2'(k+1) are selectively formed in the LD region A of the substrate 1, and that a $SiO_2$ mask 53 has a different pattern from that of the mask 3 in the second embodiment.

Specifically, as shown in FIG. 12A, the gratings 2'(k−1), 2(k), and 2'(k+1) has a length of $L_s$, which is equal to the length of the LD region A (here, $L_s$=400 μm).

As shown in FIG. 12B, the mask 53 has open windows 13 (k−1), 13(k), and 13(k+1) and pairs of masking regions 53(k−1), 53(k), and 53(k+1). The open windows 13(k−1), 13(k), and 13(k+1) has a same width of We (here, $W_o$=10 μm) over the LD and modulator regions A and B.

Each of the pair of masking regions 53(k−1) has a width of $W_{m(k-1)}$ in the LD region A and a width of $W_{mm(k-1)}$ in the modulator region B, where $W_{m(k-1)} > W_{mm(k-1)}$. Each of the pair of masking regions 53k has a width of $W_{mk}$ in the LD region A and a width of $W_{mmk}$ in the modulator region B, where $W_{mk} > W_{mmk}$. Each of the pair of masking regions 53(k+1) has a width of $W_{m(k+1)}$ in the LD region A and a width of $W_{mm(k+1)}$ in the modulator region B where $W_{m(k-1)} > W_{mm(k+1)}$.

The widths $W_{m(k-1)}$, $W_{mk}$, and $W_{m(k+1)}$ in the LD region A are the same. The widths $W_{mm(k-1)}$, $W_{mk}$, and $Wm_{m(k+1)}$ in the modulator region B are different, where $W_{mm(k-1)} < W_{mk} < W_{mm(k+1)}$. Here, $W_{mm1}$=7 μm (at $\Lambda_1$=237.0 nm) and $W_{mmn}$=12 μm (at $\Lambda_m$=242.0 nm).

Subsequently, using the patterned $SiO_2$ layer 53 as a mask, the n-type InGaAsP guiding layers 4(k−1), 4(k), and 4(k+1), the InGaAsP/InGaAsP MQW active layers 5(k−1), 5(k), and 5(k+1), the p-type InP cladding layers 6(k−1), 6(k), and 6(k+1) are successively and epitaxially grown by an MOVPE process on the upper main surface of the substrate 1 in the respective stripe-shaped windows 13 (k−1), 13(k), and 13(k+1), resulting in the (k−1)-th, k-th, and (k+1)-th ridge structures, as shown in FIG. 12C.

The parts of the (k−1)-th, k-th, and (k+1)-th guiding layers 4(k−1), 4(k), and 4(k+1) in the LD region A have the above-explained diffraction gratings 2(k−1), 2(k), and 2(k+1) due to the gratings 2'(k−1), 2'(k), and 2'(k+1) on the substrate 1.

Through this MOVPE process, the parts of the active layers 5(k−1), 5(k), and 5(k+1) in the ridge structures in the modulator region B are formed to have different thickness and different bandgap wavelengths corresponding to the widths $Wm_{m(k-1)}$, $W_{mmk}$, and $W_{mm(k+1)}$ of the masking regions.

During this selective MOVPE growth process, the same multilayer structures (not shown in FIG. 12C) as those of the ridge structures are formed on the respective intermediate areas 54, because the upper main surface of the substrate 1 is exposed from the mask 53 in the areas 14.

Figure 12D:
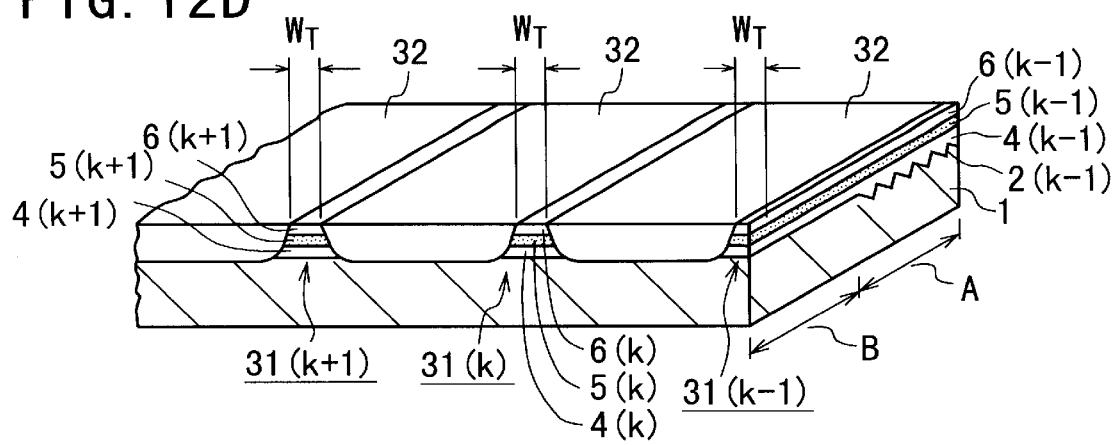

Subsequently, after the mask 53 is removed from the substrate 1, the ridge structures are etched to form the mesa stripes 31(k−1), 31(k), 31(k+1) with a same top width of 1.5 μm in the windows 13(k−1), 13(k), 13(k+1) and to overlap with the gratings 2(k−1), 2(k), and 2(k+1) by popular photolithography and etching processes, as shown in FIG. 12D. During this etching process, the unnecessary ridge structures grown on the intermediate areas 14 (not shown in FIG. 12C) are removed.

Then, the high-resistance, Fe-doped InP burying layer 32 (3 μm in thickness) is formed to cover the mesa stripes 31(k−1), 31(k), and 31(k+1) by a selectively epitaxial growth process, as shown in FIG. 12D. The tops of the stripes 31(k−1), 31(k), and 31(k+1) are exposed from the burying layer 32.

Figure 12E:
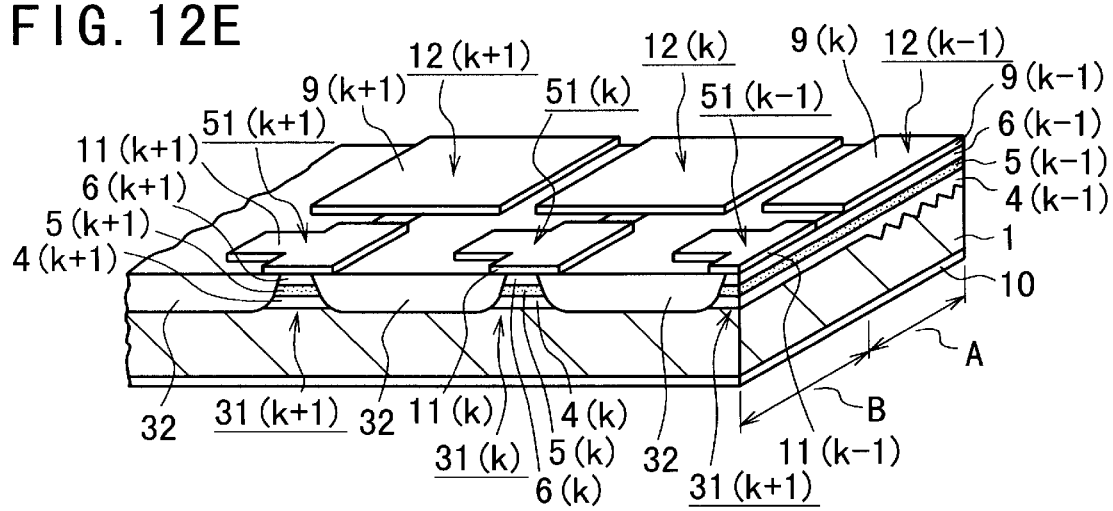

Further, as shown in FIG. 12E, the upper metal electrodes 9(k−1), 9(k), and 9(k+1) are formed on the high-resistance InP burying layer 32 to be contacted with and electrically connected to the InP cladding layers 6(k−1), 6(k), 6(k+1) in the LD region A respectively. At the same time, the upper metal electrodes 11(k−1), 11(k), and 11(k+1) are formed on the InP burying layer 32 to be contacted with the cladding layers 6(k−1), 6(k), and 6(k+1) in the modulator region B, respectively. The upper metal electrodes 9(k−1), 9(k), and 9(k+1) in the LD region A are electrically insulated from each other. The upper metal electrodes 11(k−1), 11(k), and 11(k+1) in the modulator region B are electrically insulated from each other.

The lower metal electrode 10 is formed on the lower main surface of the substrate 1. The upper metal electrodes 9(k−1), 9(k), and 9(k+1) are electrically insulated from each other.

Thereafter, the substrate 1 is cleaved at a specific interval to have the length of the LD region A of 400 μm and the length of the modulator region B of 200 μm. Anti-reflection (AR) films (not shown) are formed on the respective cleavage planes of the substrate 1 on the modulator side and high-reflection (ER) films (not shown) are formed on the respective cleavage planes of the substrate 1 on the LD side.

Thus, the LD array according to the fourth embodiment as shown in FIGS. 10 and 11 are fabricated.

With the LD array according to the fourth embodiment of the present invention, the first to n-th guiding layers 4(1) to 4(n) of the first to n-th LDs 12(1) to 12(n) have the first to n-th diffraction gratings 2(1) to 2(n) with the first to n-th periods, respectively. Therefore, the first to n-th oscillation wavelengths of the first to n-th LDs 12(1) to 12(n) have values corresponding to the first to n-th periods of the gratings 2(1) to 2(n) in the LD region A, respectively. In other words, the parts of the first to n-th active layers 4(1) to 4(n) in the LD region A have a relationship that the (k+1)-th oscillation wavelength of the (k+1)-th LD 12(k+1) is equal to the sum of the k-th oscillation wavelength of the k-th LD and a wavelength increment, where $1 \leq k \leq (n-1)$.

On the other hand, the parts of the first to n-th active layers 4(1) to 4(n) in the modulator region B have a relationship that the (k+1)-th optical-absorption edge wavelength of the (k+1)-th active layer of the (k+1)-th optical modulator 51(k+1) is equal to the sum of the k-th optical-absorption edge wavelength of the k-th active layer of the k-th optical modulator 51(k) and the corresponding wavelength increment, where $1 \leq k \leq (n-1)$.

Further, the first to n-th wavelengths differences of the first to n-th oscillation wavelengths from the corresponding first to n-th optical-absorption edge wavelengths are within the specific acceptable range for proper optical outputs and proper optical extinction ratios of the first to n-th optical modulators 51(1) to 52(n).

As a result, the first to n-th optical modulators 51(1) to 52(n) have approximately a same modulation characteristic independent of an oscillation wavelength span of the first to n-th LDs 12(1) to 12(n). This means that the modulation characteristic fluctuation of the first to n-th modulators 51(1) to 52(n) is limited within the specific acceptable range for proper optical outputs and proper optical ex Unction ratios of the first to n-th optical modulators 51(1) to 52(n) independent of an oscillation wavelength span of the first to n-th LDs 12(1) to 12(n).

The inventors fabricated the LD array with the same configuration as that in the fourth embodiment and they performed confirmation tests about this array. The following results were obtained from the tests.

The number n of the LDs was set as 16, i.e., n=16. The increment ΔΛ of the period or pitch of the diffraction gratings 2(1) to 2(n) was set as 0.33 nm. The oscillation wavelength of the of first LD (which corresponds to the shortest period of the diffraction grating) was 1530 nm, and the oscillation wavelength k of the n-th or sixteenth LD (which corresponds to the longest period of the diffraction grating) was 1562 nm. The threshold currents of the first to n-th (or sixteenth) LDs were in the range of 9±2 mA.

The absorption-edge wavelengths $\lambda_{m1}$ and $\lambda_{mn}$ of the first to n-th modulators were 1460 nm and 1490 nm. Therefore, the wavelength differences $(\lambda_{dfg1}-\lambda_{m1})$ to $(\lambda_{dfgn}-\lambda_{mn})$ i.e., the detuning, were in the range of 60 to 75 nm. This meant that the modulation characteristics of the optical modulators were extremely uniform.

The modulation voltage required for an extinction ratio of 13 dB was 2 $V_{p-p} \pm 0.2$ V. The optical output from the modulators was 11 mW±2 mW while the injection current of 10 mA was supplied to the LDs and no bias was applied to the optical modulators.

There is an additional advantage that the wavelength chirping was low, because the LDs 12(1) to 12(n) are buried by the high-resistance InP layer 32. Therefore, this LD array is capable of high-speed modulation at a rate of 5 Gb/sec or more.

The detuning fluctuation is in the range of ±7.5 nm from 67.5 nm.

Although the masking regions of the SiO$_2$ mask layer 53 have a same width in the LD region A of the substrate 1 in the third and fourth embodiments, they may be changed according to the periods of the gratings 2(1) to 2(n) as shown in the first and second embodiments. In this case, there is an additional advantage of increased characteristic uniformity of the LD array, because the threshold currents of the LDs are kept approximately constant independent of the oscillation wavelengths of the LDs.

In the above first to fourth embodiments, the first to n-th LDs are of the DFB type. However, any other type of the LDs such as the Distributed-Bragg-Reflector (DBR) or Distributed-Reflector (DR) type may be used for the present invention.

Also, InGaAsP/InGaAsP system materials are used in the above first to fourth embodiments. However, any other materials such as InGaAsP/InAlGaAs InGaAs/InAlGaAs, AlGaAs/GaAs, AlGaAs/GaAs, and InGaAs/AlGaAs may be used.

The LDs have oscillation wavelength of the 1.55 µm bandwidth in the above first to fourth embodiments. However, it is needless to say that any LD having any other bandwidth may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A laser diode array comprising:

a semiconductor substrate; and first to n-th single-axial-mode laser diodes arranged on said substrate, where n is an integer equal to or greater than 2;

wherein said first to n-th laser diodes are comprised of first to n-th stripe-shaped semiconductor active layers formed on or over said substrate, first to n-th stripe-shaped semiconductor guiding layers formed on one side of said first to n-th active layers, respectively, and first to n-th stripe-shaped semiconductor cladding layers formed on the other side of said first to n-th active layers, respectively;

and wherein said first to n-th guiding layers have first to n-th diffraction gratings with first to n-th periods, respectively; said first to n-th periods having a relationship that said (k+1)-th period is equal to a sum of the k-th period and a period increment, where k is an integer ranging from 1 to (n−1);

and wherein said first to n-th active layers have first to n-th gain peak wavelengths, respectively; said first to n-th gain peak wavelengths having a relationship that said (k+1)-th gain peak wavelength is equal to a sum of the k-th gain peak wavelength and a wavelength increment;

and wherein said first to n-th laser diodes have first to n-th oscillation wavelengths with first to n-th wavelength differences from said first to n-th gain peak wavelengths, respectively; said first to n-th wavelength differences being within a specific acceptable range for low threshold currents and low wavelength chirping of said first to n-th laser diodes.

2. A laser diode array as claimed in claim 1, wherein said specific range-for low threshold currents and low wavelength chirping of said first to n-th laser diodes is ±10 nm of a specific value.

3. A laser diode array as claimed in claim 1, wherein each of said first to n-th wavelength differences is negative and has an absolute value of 20 nm or less.

4. A laser diode array comprising:

a semiconductor substrate;

first to n-th single-axial-mode laser diodes arranged on said substrate, first to n-th optical modulators arranged on said substrate to be optically coupled with said first to n-th laser diodes, respectively, where n is an integer equal to, or greater than 2;

said first to n-th laser diodes being located in an LD region of said substrate; and said first to n-th optical modulators being located in a modulator region of said substrate;

first to n-th stripe-shaped semiconductor active layers formed on or over said substrate;

first to n-th stripe-shaped semiconductor guiding layers formed on one side of said first to n-th active layers, respectively;

first to n-th stripe-shaped semiconductor cladding layers formed on the other side of said first to n-th active layers, respectively;

parts of said first to n-th active layers, parts of said first to n-th guiding layers, and parts of said first to n-th cladding layers being located in said LD region of said substrate to constitute said first to n-th LDs, respectively;

parts of said first to n-th: active layers, parts of said first to n-th guiding layers and parts of said first to n-th cladding layers being located in said modulator region of said substrate to constitute said first to n-th optical modulators, respectively;

said parts of said first to n-th guiding layers located in said LD region of said substrate having first to n-th diffraction gratings with first to n-th periods, respectively; said first to n-th periods having a relationship that said (k+1)-th period is equal to a sum of said k-th period and a period increment, where k is an integer ranging from 1 to (n−1);

said parts of said first to n-th active layers located in said LD region of said substrate having first to n-th oscillation wavelengths, respectively;

said parts of said first to n-th active layers located in said modulator region of said substrate having first to n-th optical-absorption edge wavelengths, respectively; said first to n-th optical-absorption edge wavelengths having a relationship that (k+1)-th optical-absorption edge wavelength is equal to a sum of the k-th optical-absorption edge wavelength and a wavelength increment;

said first to n-th oscillation wavelengths of said first to n-th LDs having first to n-th wavelength differences from said first to n-th optical-absorption edge wavelengths of said first to n-th optical modulators, respectively; said first to n-th wavelength differences being within a specific acceptable range for proper optical outputs and proper optical extinction ratios of said first to n-th optical modulators.

5. A laser diode array as claimed in claim 4, wherein said specific acceptable range for satisfactory optical outputs and satisfactory optical extinction ratios of said first to n-th optical modulators is ±15 nm of a specific value.

6. A laser diode array as claimed in claim 4, wherein each of said first to n-th wavelength differences is 50 nm to 80 nm.

7. A fabrication method of a laser diode array, said method comprising the steps of:

(a) forming first to n-th stripe-shaped semiconductor active layers on or over a semiconductor substrate, where n is an integer equal to or greater than 2;

(b) forming first to n-th stripe-shaped semiconductor guiding layers on one side of said first to n-th active layers, respectively; and (c) forming first to n-th stripe-shaped semiconductor cladding layers on the other side of said first to n-th active layers, respectively;

wherein said first to n-th guiding layers have first to n-th diffraction gratings with first to n-th periods, respectively; said (k+1)-th period being equal to a sum of said k-th period and a period increment., where k is an integer ranging from 1 to (n−1);

and wherein said first to n-th active layers, said first to n-th guiding layers, and said first to n-th cladding layers constitute first to n-th single-axial-mode laser diodes, respectively;

and wherein said steps (a),(b), and (c) are successively performed by selective epitaxial growth using a same dielectric mask; said dielectric mask having first to n-th stripe-shaped open windows and first to n-th pairs of stripe-shaped masking regions respectively located at each side of said first to n-th windows;

and wherein said first to n-th active layers, said first to n-th guiding layers, and said first to n-th cladding layers are selectively grown in said first to n-th windows of said masks respectively;

and wherein said first to n-th pairs of said masking regions of said mask have first to n-th widths, respectively; said (k+1)-th width being equal to a sum of said k-th width and a width increment, where k is an integer ranging from 1 to (n−1);

and wherein said first to n-th Active layers have first to n-th gain peak wavelengths, respectively; said (k+1)-th gain peak wavelength being equal to a sum of said k-th gain peak wavelength and a wavelength increment;

and wherein said first to n-th LDs have first to n-th oscillation wavelengths with first to n-th differences from said first to n-th gain peak wavelengths, respectively; each of said first to n-th differences being within a specific range for low threshold currents and low wavelength chirping of said first to n-th LDs.

8. A fabrication method of a laser diode array, said method comprising the steps of:

(a) forming first to n-th stripe-shaped semiconductor active layers for first to n-th LDs and first to n-th optical modulators on or over a semiconductor substrate;

(b) forming first to n-th stripe-shaped semiconductor guiding layers for said first to n-th LDs and said first to n-th modulators on one side of said first to n-th active layers, respectively; and (c) forming first to n-th stripe-shaped semiconductor cladding lairs for said first to n-th LDs and said first to n-th modulators on the other side of said first to n-th active layers/ respectively, where n is an integer equal to or greater than 2;

wherein parts of said first to n-th guiding layers in said LD region of said substrate have first to n-th diffraction gratings with first to n-th periods, respectively; said first to n-th periods having a relationship that said (k+1)-th period is equal to a sum of said k-th period and a first increment, where k is an integer ranging from 1 to (n−1);

and wherein said steps (a), (b), and (c) are successively performed by selective epitaxial growth using a same dielectric mask; said dielectric mask having first to n-th stripe-shaped open windows and first to n-th pairs of stripe-shaped masking regions respectively located at each side of said first to n-th windows;

and wherein parts of the first to n-th pairs of the masking regions of the mask in the modulator regions have first to n-th widths, respectively. The first to n-th widths have a relationship that the (k+1)-th width is equal to a sum of the K-th width and a width increment, where k is an integer ranging from 1 to (n−1);

and wherein said first to n-th active layers, said first to n-th guiding layers, and said first to n-th cladding layers for said first to n-th LDs and said first to n-th modulators are -selectively grown in said first to n-th windows of aid mask, respectively;

and wherein parts of said first to n-th active layers, parts of said first to n-th guiding layers, and parts of said first to n-th cladding layers in said LD region of said substrate constitute said first to n-th single-axial-mode LDs, respectively;

and wherein parts of said first to n-th active layers, parts of said first to n-th guiding layers, and parts of said first to n-th cladding layers in said modulator region of said substrate constitute said first to n-th optical modulators, respectively;

and wherein said first to n-th LDs have first to n-th oscillation wavelengths with first to n-th differences from said first to n-th optical-absorption edge wavelengths, respectively; each of said first to n-th differences being within a specific range for satisfactory optical outputs and satisfactory optical extinction ratios of said first to n-th optical modulators.

9. A method as claimed in claim 8, wherein parts of said first to n-th pairs of said masking regions of said mask in said laser diode regions have first to n-th widths, respectively;

and wherein said (k+1)-th width of said parts of said masking regions in said laser diode regions is equal to a sum of said k-th width and a width increment.

* * * * *

UNITED STATES PATENT AND TRADEMARK OFFICE
CERTIFICATE OF CORRECTION

PATENT NO.   : 5,953,359
DATED        : September 14, 1999
INVENTOR(S)  : Yamaguchi et al It is certified that error appears in the above-identified patent and that said Letters Patent is hereby corrected as shown below:

Claim 4, Col. 22, line 10, " delete the "," (comma) after "to".

Claim 4, Col. 22, line 29, delete the ":" (colon) after "n-th".

Claim 4, col. 22, line 30, insert a - -,- - (comma) after "layers".

Claim 7, Col. 23, line 30, insert a - -,- - (comma) after "masks".

Claim 8, Col. 24, line 4, "layers/" should read  --layers,--

Claim 8, Col. 24, line 29, "aid" should be - -said- -.

Signed and Sealed this

Twenty-first Day of March, 2000

Attest:

Attesting Officer

Q. TODD DICKINSON

Commissioner of Patents and Trademarks